US007838483B2

(12) United States Patent
Lee et al.

(10) Patent No.: US 7,838,483 B2
(45) Date of Patent: Nov. 23, 2010

(54) PROCESS OF PURIFICATION OF AMIDOXIME CONTAINING CLEANING SOLUTIONS AND THEIR USE

(75) Inventors: Wai Mun Lee, Fremont, CA (US); Charles C. Y. Chen, Fremont, CA (US)

(73) Assignee: EKC Technology, Inc., Hayward, CA (US)

( * ) Notice: Subject to any disclaimer, the term of this patent is extended or adjusted under 35 U.S.C. 154(b) by 13 days.

(21) Appl. No.: 12/260,649

(22) Filed: Oct. 29, 2008

(65) Prior Publication Data

US 2010/0105594 A1 Apr. 29, 2010

(51) Int. Cl.
 *B01D 24/00* (2006.01)
(52) U.S. Cl. .................. 510/176; 510/175; 510/407; 510/412; 438/199; 438/745; 438/754
(58) Field of Classification Search .................. 510/176, 510/175, 407, 412; 438/199, 745, 754
 See application file for complete search history.

(56) References Cited

U.S. PATENT DOCUMENTS

| | | | |
|---|---|---|---|
| 3,480,391 A | 11/1969 | Carlos | |
| 3,544,270 A | 12/1970 | Calos et al. | |
| 3,794,488 A | 2/1974 | Henn et al. | |
| 3,882,018 A | 5/1975 | Depree | |
| 4,551,318 A | 11/1985 | Grosskinskey et al. | |
| 4,576,804 A | 3/1986 | Grosskinskey et al. | |
| 4,629,613 A | 12/1986 | Grosskinskey et al. | |
| 4,634,584 A | 1/1987 | Grosskinskey et al. | |
| 5,808,150 A | 9/1998 | Michelotti | |
| 5,981,454 A | 11/1999 | Small | |
| 6,534,681 B1 | 3/2003 | Watzenberger et al. | |
| 6,546,939 B1 | 4/2003 | Small | |
| 7,220,322 B1 | 5/2007 | Sun et al. | |
| 2001/0020348 A1 | 9/2001 | Ueda et al. | |
| 2003/0119692 A1 | 6/2003 | So et al. | |
| 2003/0171239 A1 | 9/2003 | Patel et al. | |
| 2003/0235989 A1 | 12/2003 | Jayashankar | |
| 2004/0089196 A1 | 5/2004 | Anderson et al. | |
| 2004/0214931 A1 | 10/2004 | Ihara et al. | |
| 2007/0007196 A1* | 1/2007 | Komatsu et al. ......... | 210/500.1 |
| 2007/0049025 A1 | 3/2007 | Siddiqui et al. | |
| 2009/0107520 A1 | 4/2009 | Lee et al. | |
| 2009/0111965 A1 | 4/2009 | Lee | |
| 2009/0112024 A1 | 4/2009 | Lee | |
| 2009/0130849 A1* | 5/2009 | Lee ............................. | 438/693 |
| 2009/0133716 A1 | 5/2009 | Lee | |
| 2009/0137191 A1 | 5/2009 | Lee | |
| 2010/0043823 A1 | 2/2010 | Lee | |

FOREIGN PATENT DOCUMENTS

| | | |
|---|---|---|
| DE | 3343597 | 6/1985 |
| DE | 3343599 | 6/1985 |
| EP | 1167290 | 1/2002 |
| EP | 1266956 | 12/2002 |
| EP | 1610365 | 12/2005 |
| WO | 01/62710 | 8/2001 |
| WO | 2004/099086 | 11/2004 |
| WO | 2005/072338 | 8/2005 |
| WO | 2006/036368 | 4/2006 |
| WO | 2006/062178 | 6/2006 |
| WO | 2006/107517 | 10/2006 |
| WO | 2007/050409 | 5/2007 |
| WO | 2009/058272 | 5/2009 |
| WO | 2009/058273 | 5/2009 |
| WO | 2009/058274 | 5/2009 |
| WO | 2009/058275 | 5/2009 |
| WO | 2009/058277 | 5/2009 |
| WO | 2009/058278 | 5/2009 |
| WO | 2009/058287 | 5/2009 |
| WO | 2009/058288 | 5/2009 |
| WO | 2009/085072 | 7/2009 |

OTHER PUBLICATIONS

U.S. Appl. No. 12/260,389, Lee, Filed Oct. 29, 2008, Office Action mailed Oct. 13, 2009, 10 pgs.
U.S. Appl. No. 12/260,389, Lee, Filed Oct. 29, 2008, Office Action Response mailed Jan. 12, 2010, 7 pgs.
U.S. Appl. No. 12/260,649, Lee, Filed Oct. 29, 2008, Office Action mailed Feb. 19, 2010, 11 pgs.
U.S. Appl. No. 12/260,649, Lee et al., Filed Oct. 29, 2008, Application and Drawings, 70 pgs.
U.S. Appl. No. 12/260,672, Lee et al., Filed Oct. 29, 2008, Application and Drawings, 149 pgs.
PCT/US2008/012234 (WO2009/058272), International Search Report and Written Opinion mailed Feb. 16, 2009, 10 pgs.
PCT/US2008/012235 (WO2009/058273), International Search Report and Written Opinion mailed Feb. 11, 2009, 8 pgs.
PCT/US2008/012236 (WO2009/058274), International Search Report and Written Opinion mailed Feb. 16, 2009, 9 pgs.
PCT/US2008/012237 (WO2009/085072), International Search Report and Written Opinion mailed Feb. 16, 2009, 10 pgs.
PCT/US2008/012238 (WO2009/058275), International Search Report and Written Opinion mailed Feb. 13, 2009, 9 pgs.
PCT/US2008/012240 (W02009/058277), International Search Report and Written Opinion mailed Feb. 16, 2009, 9 pgs.
PCT/US2008/012241 (WO2009/058278), International Search Report and Written Opinion mailed Feb. 13, 2009, 9 pgs.
PCT/US2008/012253 (WO2009/058287), International Search Report and Written Opinion mailed Feb. 16, 2009, 10 pgs.
PCT/US2008/012254 (WO2009/058288), International Search Report and Written Opinion mailed Feb. 20, 2009, 7 pgs.

* cited by examiner (Continued)

*Primary Examiner*—Milton I Cano
*Assistant Examiner*—M. Reza Asdjodi
(74) *Attorney, Agent, or Firm*—Dunlap Codding, P.C.

(57) ABSTRACT

The invention relates to processes for producing and using amidoxime compounds with low trace metal impurities. The invention further relates to compositions comprising amidoxime compounds with low trace metal impurities, such compositions useful for cleaning or removing residues from semiconductor substrates and/or equipment.

3 Claims, 1 Drawing Sheet

PROCESS OF PURIFICATION OF AMIDOXIME CONTAINING CLEANING SOLUTIONS AND THEIR USE

FIELD OF THE INVENTION

The present invention relates to a composition comprising an amidoxime compound having low total metal concentration, and to processes of using and making the same.

BACKGROUND OF THE INVENTION

Many amidoxime compounds can be made by cyanoethylation of a nucleophile with acrylonitrile prior the conversion to amidoxime by reacting with hydroxylamine. The nucelophile can include, but is not limited to, the following:
- compounds containing one or more —OH or —SH groups, such as water, alcohols, phenols, oximes, hydrogen sulphide and thiols;
- compounds containing one or more —NH— groups, e.g. ammonia, primary and secondary amines, hydrazines, and amides;
- ketones or aldehydes possessing a —CH—, —$CH_2$—, or —$CH_3$ group adjacent to the carbonyl group; and
- compounds such as malonic esters, malonamide and cyanoacetamide, in which a —CH— or —$CH_2$— group is situated between —$CO_2R$, —CN, or —CONH— groups.

The cyanoethylation process usually requires a strong base as a catalyst. Most often such bases are alkali metal hydroxides such as, e.g., lithium hydroxide, sodium hydroxide and potassium hydroxide. These metals, in turn, can exist as impurities in the amidoxime compound solution. The existence of such metals in the amidoxime compound solution is not acceptable for use in electronic, and more specifically, semiconductor manufacturing processes and as a stabilizer for hydroxylamine freebase and other radical sensitive reaction chemicals.

Chemical compounds which contain one or more unsaturated groups have a pronounced tendency to undergo free-radical polymerization. Such compounds are used as monomers for the targeted preparation of polymers, e.g. by free-radical polymerization. At the same time, the pronounced tendency to undergo free-radical polymerization is a disadvantage in so far as undesired, spontaneous free-radical polymerization can occur both during storage and during chemical and/or physical processing, e.g. by distillation or rectification, of the unsaturated compounds, in particular under the action of heat and/or light. Such uncontrolled free-radical polymerizations present a considerable hazard potential and frequently proceed in an explosive manner. In the distillation of mixtures comprising unsaturated compounds, polymer formed in an uncontrolled manner can, for example, deposit on the surface of the vaporizer, where the tendency to form polymer is increased as a result of the high temperatures, and thereby cause an undesirable reduction in the heat transfer. Polymer which is formed can also block the internals in rectification columns, which causes undesirable pressure drops. Finally, the rectification process has to be interrupted to remove the polymer which has been formed.

The free radical polymerization is usually caused by trace metal impurities; it is highly desirable for a chelating agent with low metal ions to be effectively function as radical quencher to inhibit the undesirable polymerization reaction.

The manufacture of advanced electronic devices such as semiconductor components historically has used thin film deposition and etching processes to construct three-dimensional circuits, typically using aluminum conductors and silica ($SiO_2$) insulation layers. Connections between layers are constructed using optical lithography, photoresist patterning and plasma etching to create a complex and extremely small-scale pattern of connecting holes through the silica insulating layers. Several hundred steps may be required for the manufacture of some semiconductor chips, with exacting requirements at each step. The constant need for increased device performance along with microminiaturization is presently leading to a switch to copper conductors and better insulating (low-k dielectric) films such as doped silica, fluorinated or porous insulation layers. For the Al/$SiO_2$ systems, post-etch cleaning formulations relied on formulations containing such chemicals as hydroxylamine or other solvents. These formulations, however, do not meet the requirements of the newer advanced chip designs and materials of construction due to high trace metal impurities.

In addition, there is a desire in the industry to find more effective and environmentally friendly aqueous-based cleaners. For instance, a dilute aqueous amidoxime compound has been discovered by Lee, which is disclosed in U.S. Patent Application No. 61/000,727 to be a highly effective chelating agent for cleaning application in the manufacture of modern semiconductor processes including front end of the line, back end of the line, post chemical mechanical planarization cleaning steps, and in slurry system for chemical mechanical planarization process.

In modern semiconductor chips, features such as conducting "via" or holes, are of the order of 60 nm or smaller in diameter. Another requirement during the many stages of the construction of a semiconductor chip is that the levels of metals, particularly metal ions in cleaning formulations must be limited to concentrations at the ppb, or ppb level. Residual metal contamination left in the substrate surface can result in unwanted conductive pathways or alter the composition and, therefore, the electrical performance of various film layers, resulting in a diminished yield of micro-assemblies meeting the rigid final performance specifications. In semiconductor wafer manufacture, there is a need for ultra low metallic impurities (ppb levels) for any processing material or liquid that will contact the wafer in order to avoid affecting the electrical properties of the integrated circuits being produced.

It would be desirable to produce amidoxime compounds which have extremely low metals concentrations for use as a component in compositions used in semiconductor processes.

SUMMARY OF THE INVENTION

Accordingly, the present invention is directed to compositions comprising amidoxime compounds with the required extremely low metal concentration. Moreover, the present invention provides processes for preparing and using such compositions.

More specifically, the present invention provides a process for cleaning a substrate comprising contacting a substrate with a composition comprising one or more amidoxime compounds and one or more metals, wherein the total metal concentration is less than 1000 ppb and the concentration of any individual metal of the composition is less than 250 ppb. In one embodiment, the substrate is a surface or structure used in the semiconductor or electronic device manufacturing process.

In another embodiment, the substrate is a surface or structure of a fully or partially fabricated electronic device or article of processing equipment. In another embodiment, the substrate is a surface or structure of a metal or silicon-based material. In another embodiment, the substrate is a metal plug; a metal or metal compound stack; or one or more layers of metal nitrdes, metal oxides, metal oxynitrides, metal alloys with atoms or compounds other than phosphorus, boron, or sulfur. In a further embodiment, the substrate is a surface or structure comprising silicon, silicon oxides, nitrides, oxynitrides, modified silicon materials with atoms or compounds other than silicon such as phosphorus, boron, sulfur, carbon, fluorine, or germanium, and combinations of two or more thereof.

In one embodiment, the composition used in the above process can further include from about 1% to about 15% by weight of an organic solvent. Such organic solvents can include, but are not limited to dimethylsulfoxide, propylene glycol, N-methyl-2-pyrrolidone or mixtures thereof.

In one embodiment, the composition used in the process of the invention can further include an acid, a base, a fluorine-containing compound, a chelating agent or combinations of two or more thereof. The acid can include a carboxylic acid, phosphoric acid, or mixtures thereof. The base can include a hydroxylamine, tetraalkyammonium hydroxide, an alkanolamine, or mixtures thereof. The fluorine-containing compound can include ammonium fluoride, ammonium bifluoride or mixtures thereof. The chelating agent can include catechol, benzotriazole or mixtures thereof.

The present invention also provides a composition comprising one or more amidoxime compounds and one or more metals, wherein the total metal concentration is less than 1000 ppb and the concentration of any individual metal of the composition is less than 250 ppb. The one or more metals can be selected from the group consisting of aluminum, calcium, chromium, copper, iron, lead, magnesium, manganese, nickel, potassium, sodium, and zinc, and combinations of two or more thereof. Preferably, the composition is in the form of an aqueous solution.

The present invention further provides for a process to produce a composition comprising one or more amidoxime compounds with an ultralow metal concentration, the process comprising the steps of:

(a) providing one or more vessels comprising therein at least one strongly acidic cation resin;

(b) contacting the resin with a flow of a strong acid to produce an acid-treated resin;

(c) washing the resin with a flow of deionized water in a concurrent flow direction to the flow of strong acid to produce a resin substantially free of soluble acid;

(d) contacting the acid-treated and washed resin with a flow in a countercurrent flow direction to the flow of strong acid of a feed composition comprising an amidoxime containing solution and one or more metals wherein the total metal concentration is greater than about 1000 ppb and the individual metal concentration is greater than about 250 ppb to produce a resin-treated amidoxime containing solution and spent resin; and (e) separating and recovering the resin-treated amidoxime containing solution to form a composition, wherein the composition has a total metal concentration less than 1000 ppb and the concentration of any individual metal of the composition is less than 250 ppb.

It is to be understood that both the foregoing general description and the following detailed description are exemplary and explanatory and are intended to provide further explanation of the invention as claimed.

BRIEF DESCRIPTION OF THE FIGURES

The accompanying figures, which are included to provide a further understanding of the invention and are incorporated in and constitute part of this specification, illustrate embodiments of the invention and together with the description serve to explain the principles of the invention.

DETAILED DESCRIPTION OF THE INVENTION

Figure 1:
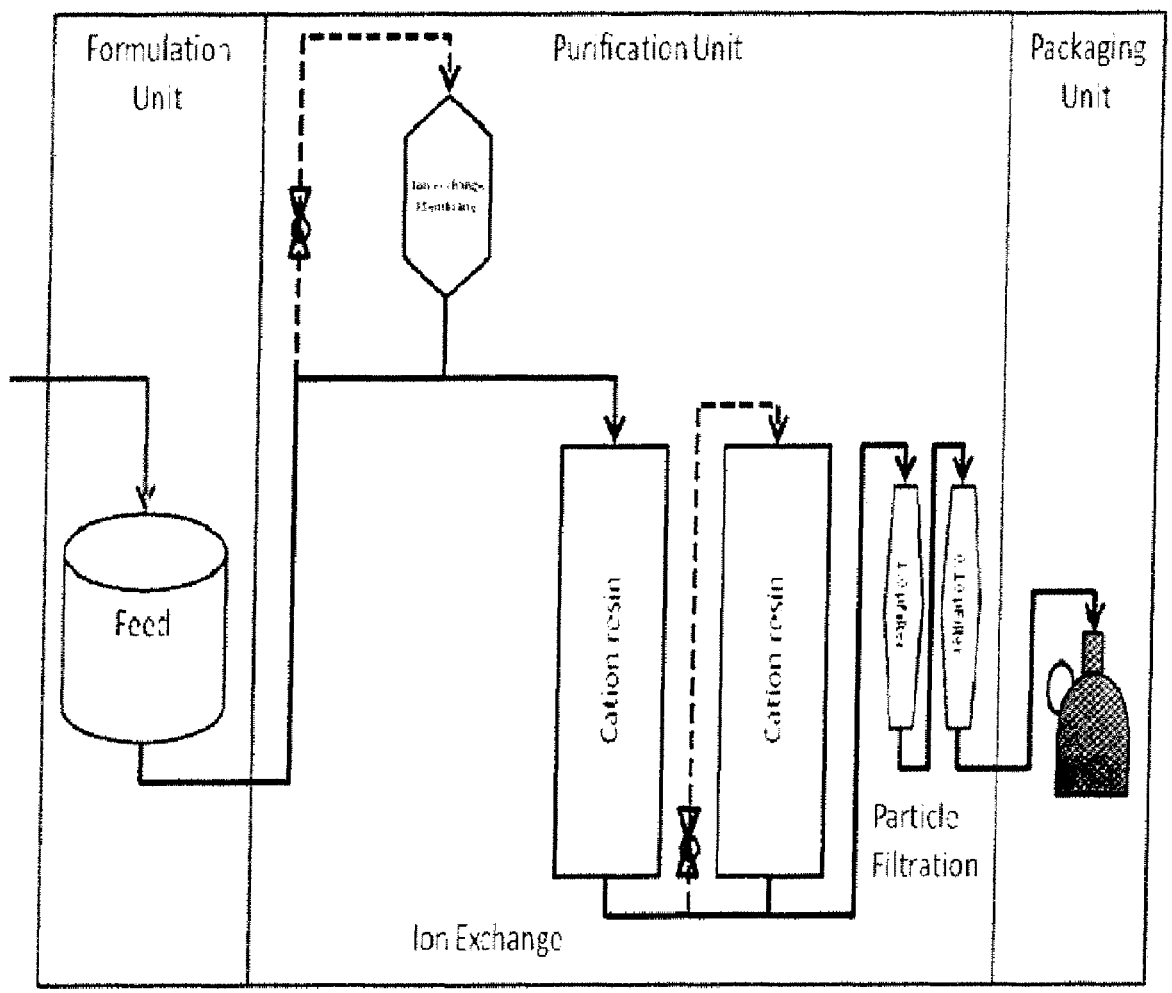
FIG. 1 is a diagram of the amidoxime purification process in accordance with one embodiment of the present invention

Trademarks which are used herein are shown in upper case.

The term "total metal concentration" as used herein means the total metal concentration of the specified metals as analyzed, and includes ionic and nonionic forms. The term "individual metal concentration" as used herein means the metal concentration of that individual metal as analyzed, and includes ionic and nonionic forms.

The terms "deionized water" or "DI water" as used herein means purified water having a resistivity of >15 M ohm and preferably >17 M ohm. Resistivity measurements utilize a conductivity/resistivity probe, such as a NIST-traceable Digital Conductivity Meter, No. 23226-501, from made by VWR International (West Chester, Pa., USA). DI water suitable for the practice of the present invention is often obtained from "turn-key" units such as a Sybron-Barnstead "NANOPURE II" unit, available from Barnstead-Thermolyne (Dubuque, Iowa, USA).

The invention relates, in part, to a composition which comprises an amidoxime compound and one or more metals, the metals concentration being less than about 1000 ppb, and preferably less than about 500 ppb, of the composition. In one embodiment, the individual metal concentrations are less than about 250 ppb, preferably less than about 150 ppb, and more preferably less than about 100 ppb of the composition.

The metals present in the compositions are trace metal impurities which, as discussed in more detail below, are detrimental to most applications in which the compositions are used. In one particular composition, the metal is a member of the group consisting of sodium, magnesium, aluminum, potassium, calcium, iron, nickel and zinc and combinations of two or more thereof. This composition comprises an amidoxime compound having a concentration of sodium, magnesium, aluminum, potassium, calcium, iron, nickel, and zinc of less than 200 and preferably less than 100 ppb of the composition. In the various applications of the compositions of the present invention, the specific requirements for total metals and for individual metals are expected to vary. For instance, for use in a copper-based system, specific requirements for the reduction of the copper concentration would be substantially less stringent.

Such low total metal concentration amidoxime compounds—that is, amidoxime compounds comprising one or more metals wherein the total metal concentration is less than about 1000 ppb and wherein individual metal concentrations are less than about 250 ppb—are referred to herein as "electronics grade" or "semiconductor grade" wet chemicals, suitable as components of a number of cleaning and surface preparation chemicals, for instance as components of post-etch cleaning formulations. The actual total metal concentration and concentrations of individual metals varies, depending on the end use of the amidoxime compound composition. Therefore, for certain applications, "electronics grade" or "semiconductor grade" amidoxime compound may require a total metal concentration less than 500 ppb and an individual metal concentration of less than 100 ppb. Such formulations enable the reliable cleaning of, for example, etched "via" or holes.

In another embodiment, the invention comprises a composition comprising an amidoxime compound and one or more metals in which the total metal concentration is less than about 200 ppb, preferably less than about 150 ppb and more preferably less than about 100 ppb of the composition. Individual metal concentrations are less than about 100 ppb, preferably less than about 50 ppb, and more preferably less than about 25 ppb of the composition.

Generally all known water-soluble amidoxime compounds can be suitable for use in the composition and process of the present invention. Of particular interest are those amidoxime compounds useful in the semiconductor industry such as, for example, those selected from the examples that follow. These exemplary amidoxime compounds also include a reaction pathway for their synthesis.

Nomenclatures are translated from chemical structures to their corresponding chemical names using ChemBioDraw Ultra from CambridgeSoft, MA. In the case for products from the reaction of sorbitol, the cyanoethylated sorbitol is given by its CAS# [2465-92-1] as 1,2,3,4,5,6-hexakis-O-(2-cyanoetyl)hexitol with chemical formula of $C_{24}H_{32}N_6O_6$ and the corresponding amidoxime compound as 1,2,3,4,5,6-hexakis-O-[3-(hydroxyamino)-3-iminopropyl] Hexitol, CAS# [950752-25-7].

Abbreviations

| | |
|---|---|
| Isopropyl Alcohol | iPrOH |
| Ethanol | EtOH |
| Millimole | mmole |
| Equivalent | eq |
| Ethyl Acetate | EtOAc |
| Parts per million | ppm |
| Parts per billion | ppb |
| Methanol | MeOH |
| Gram | g |
| Ether | Et2O |
| Hydrochloride acid | HCl |
| Boiling point | Bp |
| Melting point | Mp |
| Room temperature | Rt, RT |
| Decomposed | Dec |
| Tetramethylammonium hydroxide | TMAH |
| Trimethylbenzylammonium hydroxide (40% in MeOH) | Triton B, |
| Ethylenediamine tetracarboxylic acid | EDTA |
| Methylene chloride | $CH_2Cl_2$ |
| Catalytic | Cat |

For the purpose of the present invention, amidoximes are compounds which contain the tautomeric atom grouping:

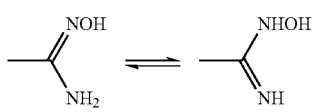

Provided herein are exemplary syntheses of amidoxime compounds from nitriles and cyanoethylated nitrite compounds. All glassware, including glass spatulas, were rinsed with 5% $HNO_3$ followed by deionized water before use. Deionized water was used in the procedures.

Reactions to produce nitrile precursors to amidoxime compounds

Cyanoethylation of Diethylaminexine

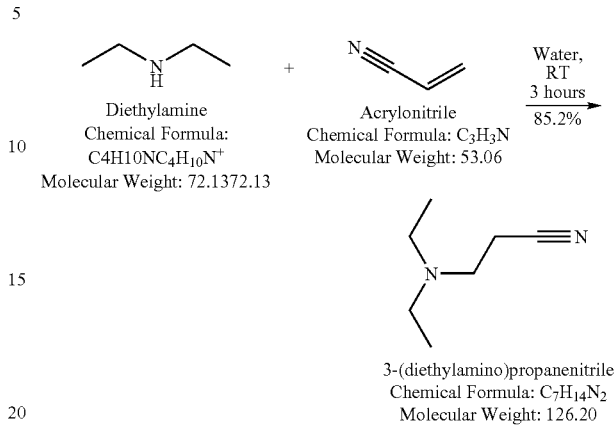

Diethylamine
Chemical Formula:
$C_4H_{10}NC_4H_{10}N^+$
Molecular Weight: 72.1372.13

Acrylonitrile
Chemical Formula: $C_3H_3N$
Molecular Weight: 53.06

3-(diethylamino)propanenitrile
Chemical Formula: $C_7H_{14}N_2$
Molecular Weight: 126.20

A solution of diethylamine (1 g, 13.67 mmol) and acrylonitrile (0.798 g, 15 mmol 1.1 eq) in water (10 cm³) was stirred at room temperature for 3 hours, after which the mixture was extracted with dichloromethane (2×50 cm³). The organic extracts were evaporated under reduced pressure to give the pure cyanoethylated compound 3-(diethylamino) propanenitrile (1.47 go 85.2%) as an oil.

Monocyanoethylation of Glycine 2-aminoacetic acid
Chemical Formula:
$C_2H_5NO_2$
Molecular Weight: 75. 07 acrylonitrile
Chemical Formula: $C_3H_3N$
Molecular Weight: 53.06

TMAH (1 eq)
RT 24 hours
then HCl (1 eq)
69.6%

2-(2-cyanoethylamino)acetic acid
Chemical Formula: $C_5H_8N_2O_2$
Molecular Weight: 128.13

Glycine (5 g, 67 mmol) was suspendeed in water (10 cm³) and TMAH (25% in water, 24.3 g, 67 mmol) was added slowly, keeping the temperature at <30° C. with an ice-bath. The mixture was then cooled to 10° C. and acrylonitrile (3.89 g, 73 mmol) was added. The mixture was stirred overnight, and allowed to warm to room temperature slowly. The mixture was then neutralized with HCl (6M, 11.1 cm³), concentrated to 15 cm³ and diluted to 100 cm³ with EtOH. The solid precipitated was collected by filtration, dissolved in hot water (6 cm³) and re-precipitated with EtOH (13 cm³) to give 2-(2-cyanoethylamino)acetic acid (5.94 g, 69.6%) as a white solid, mp 192° C. (lit mp 190-191° C.).

Cyanoethylation of Piperazinexine

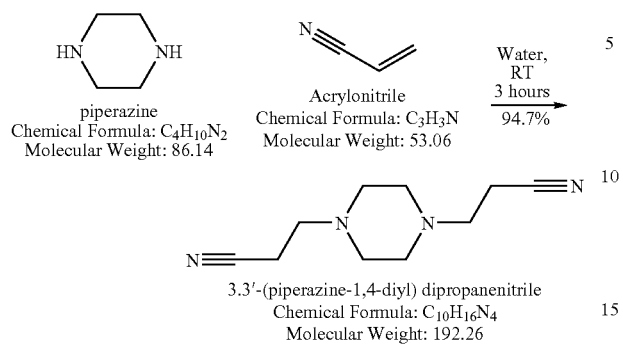

3,3'-(piperazine-1,4-diyl) dipropanenitrile
Chemical Formula: $C_{10}H_{16}N_4$
Molecular Weight: 192.26

A solution of piperazine (1 g, 11.6 mmol) and acrylonitrile (1.6 g, 30.16 mmol, 2.6 eq) in water (10 cm$^3$) was stirred at room temperature for 5 hours, after which the mixture was extracted with dichloromethane (2×50 cm$^3$). The organic extracts were evaporated under reduced pressure to give the pure doubly cyanoethylated compound 3,3'-(piperazine-1,4-diyl)dipropanenitrile (2.14 g, 94.7%) as a white solid, mp 66-67° C.

Cyanoethylation of 2-ethoxyethanol

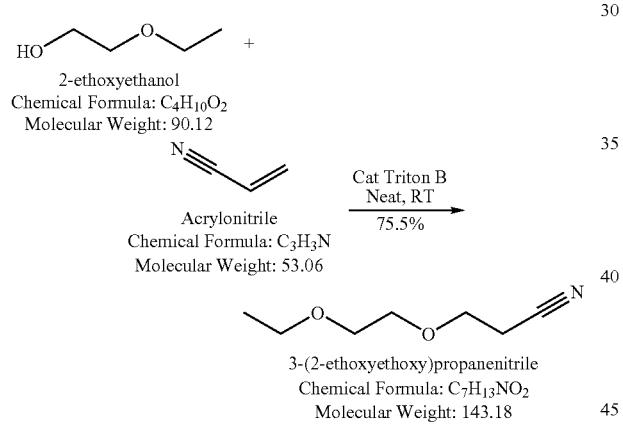

3-(2-ethoxyethoxy)propanenitrile
Chemical Formula: $C_7H_{13}NO_2$
Molecular Weight: 143.18

To an ice-water cooled mixture of 2-ethoxyethanol (1 g, 11.1 mmol) and Triton B (40% in MeOH, 0.138 g, 0.33 mmol) was added acrylonitrile (0.618 g, 11.6 mmol). The mixture was stirred at room temperature for 24 hours. It was then neutralized with 0.1 M HCl (3.3 cm$^3$) and extracted with $CH_2Cl_2$ (2×10 cm$^3$). The extracts were concentrated under reduced pressure and the residue was Kugelrohr-distilled to give the product 3-(2-ethoxyethoxy)propanenitrile (1.20 g, 75.5%) as a colourless oil, bp 100-130° C./20 Torr.

Cyanoethylation of 2-(2-dimethylaminoethoxy)ethanol

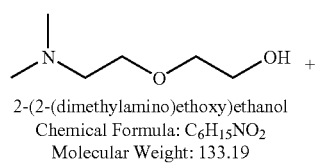

2-(2-(dimethylamino)ethoxy)ethanol
Chemical Formula: $C_6H_{15}NO_2$
Molecular Weight: 133.19

-continued

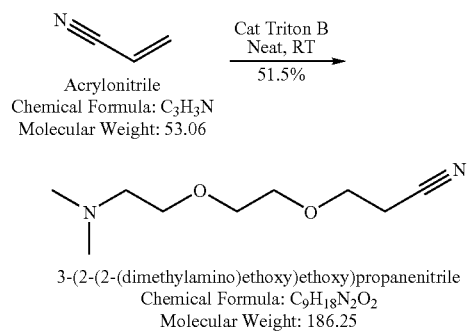

3-(2-(2-(dimethylamino)ethoxy)ethoxy)propanenitrile
Chemical Formula: $C_9H_{18}N_2O_2$
Molecular Weight: 186.25

To an ice-water cooled mixture of 2-(2-dimethyleminothoxy)ethanol (1 g, 7.5 mmol) and Triton B (40% in MeOH, 0.094 g, 0.225 mmol) was added acrylonitrile (0.418 g, 7.9 mmol), and the mixture was stirred at room temperature for 24 hours. It was then neutralized with 0.1 M HCl (2.3 cm$^3$) and extracted with $CH_2Cl_2$ (2×10 cm$^3$). The extracts were concentrated under reduced pressure and the residue was purified by column chromatography (silica, $Et_2O$, 10% $CH_2Cl_2$, 0-10% EtOH) to give 3-(2-(2-(dimethylamino)ethoxy)ethoxy)propanenitrile as an oil.

Cyanoethylation of Isobutyraldehyde

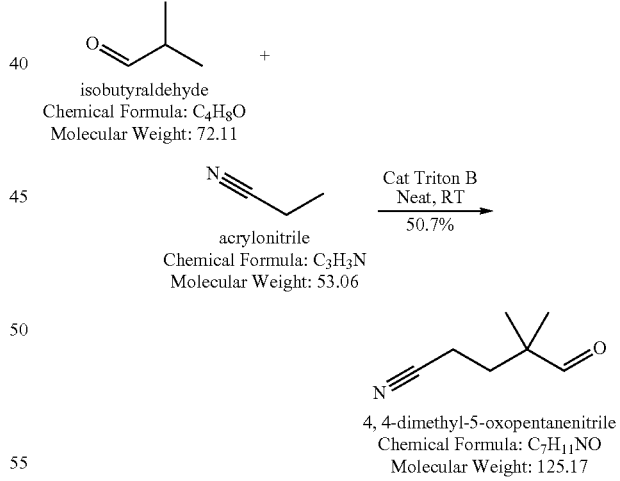

4,4-dimethyl-5-oxopentanenitrile
Chemical Formula: $C_7H_{11}NO$
Molecular Weight: 125.17

Isobutyraldehyde (1 g, 13.9 mmol) and acrylonitrile (0.81 g, 15 mmol) were mixed thoroughly and cooled with an ice-bath. Triton B (40% in MeOH, 0.58 g, 1.4 mmol) was added. The mixture was stirred at room temperature overnight. It was then neutralized with 0.1 M HCl (14 cm$^3$) and extracted with $CH_2Cl_2$ (100 cm$^3$). The extracts were concentrated under reduced pressure and the residue was Kugelrohr-distilled to give the product 4,4dimethyl-5-oxopentanenitrile (0.8 g, 50.7%) as an oil, bp 125-130° C./20 Torr.

Cyanoethylation of Aniline

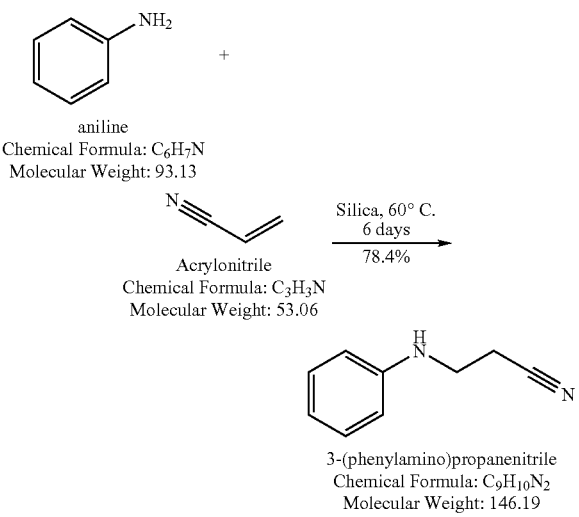

Silica was activated by heating it above 100° C. in vacuum and was then allowed to cool to room temperature under nitrogen. To the activated silica (10 g) was absorbed aniline (1.86 g, 20 mmol) and acrylonitrile (2.65 g, 50 mmol) and the flask was capped tightly. The contents were then stirred with a magnetic stirrer for 6 days at 60° C. After this time the mixture was cooled to room temperature and extracted with MeOH. The extracts were evaporated to dryness and the residue was Kugelrohr-distilled under high vacuum to give the product 3-(phenylamino)propanenitrile (2.29 g, 78.4%) as an oil which crystallised on standing; bp 120-150° C./1-2 Torr (lit bp 120° C.1 Torr), mp 50.5-52.5° C.

Cyanoethylation of Ethylenediamine

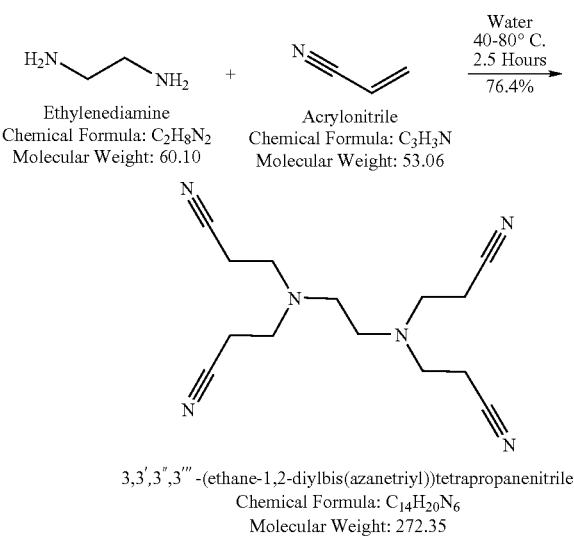

Acrylonitrile (110 g, 137 cm$^3$, 2.08 mol) was added to a vigorously stirred mixture of ethylenediamine (25 g, 27.8 cm$^3$, 0.416 mol) and water (294 cm$^3$) at 40° C. over 30 min. During the addition, it was necessary to cool the mixture with a 25° C. water bath to maintain temperature at 40° C. The mixture was then stirred for additional 2 hours at 40° C. and 2 hours at 80° C. Excess acrylonitrile and half of the water were evaporated off and the residue, on cooling to room temperature, gave a white solid which was recrystallised from MeOH-water (9:1) to give pure product 3,3',3",3'''-(ethane-1,2-diylbis(azanetriyl))tetrapropanenitrile (86.6 g, 76.4%) as white crystals, mp 63-65° C.

Cyanoethylation of Ethylene Glycol

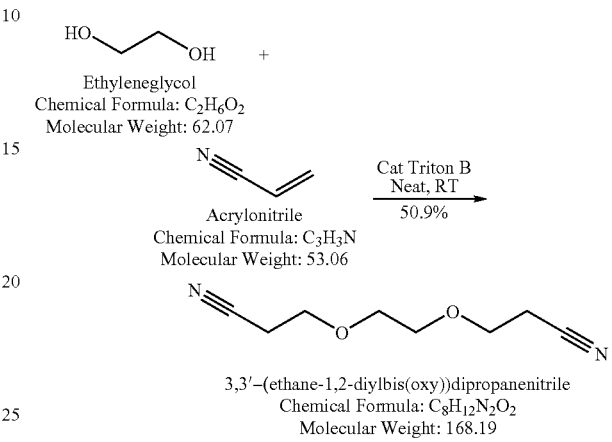

Small scale: Ethylene glycol (1 g, 16.1 mmol) was mixed with Triton B (40% in MeOH, 0.22 g, 0.53 mmol) and cooled in an ice-bath, while acrylonitrile (1.71 g 32.2 mmol) was added. The mixture was stirred at room temperature for 60 hours after which it was neutralized with 0.1 M HCl (0.6 cm$^3$) and extracted with CH$_2$Cl$_2$ (80 cm$^3$). The extracts were concentrated under reduced pressure, and the residue was Kugelrohr-distilled to give 3,3'-(ethane-1,2-diylbis(oxy))dipropanenitrile (1.08 g, 39.9%) as a light coloured oil, bp 150-170° C./20 Torr.

Large scale: Ethylene glycol (32.9 g, 0.53 mol) was mixed with Triton B (40% in MeOH, 2.22 g, 5.3 mmol) and cooled in an ice-bath while acrylonitrile (76.2 g, 1.44 mol) was added. The mixture was allowed to warm slowly to room temperature and stirred for 60 hours after which it was neutralized with 0.1 M HCl (50 cm$^3$) and extracted with CH$_2$Cl$_2$ (300 cm$^3$). The extracts were passed through a silica plug three times to reduce the brown colouring to give 86 g (quantitative yield) of the product as an amber coloured oil, pure by $^1$H-NMR, containing 10 g of water (total weight 96 g, amount of water calculated by $^1$H NMR integral sizes).

Cyanoethylation of Diethyl Malonate

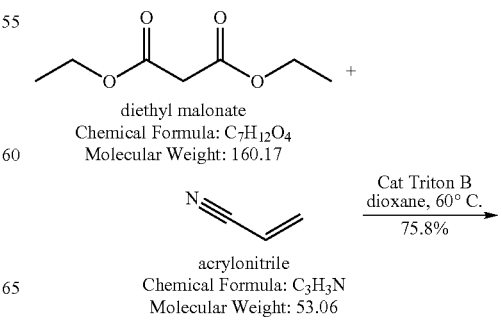

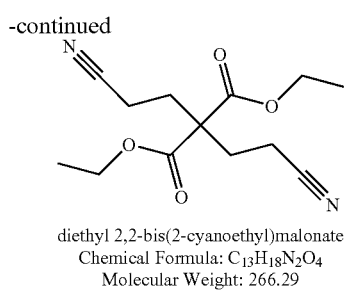

diethyl 2,2-bis(2-cyanoethyl)malonate
Chemical Formula: $C_{13}H_{18}N_2O_4$
Molecular Weight: 266.29

To a solution of diethyl malonate (1 g, 6.2 mmol) and Triton B (40% in MeOH, 0.13 g, 0.31 mmol) in dioxane (1.2 cm³) was added dropwise acrylonitrile (0.658 g, 12.4 mmol) and the mixture was stirred at 60° C. overnight. The mixture was then cooled to room temperature and neutralized with 0.1 M HCl (3 cm³) and poured to ice-water (10 cm³). Crystals precipitated during 30 min. These were collected by filtration and recrystallised from EtOH (cooling in freezer before filtering off) to give diethyl 2,2-bis(2-cyanoethyl)malonate (1.25 g, 75.8%) as a white solid, mp 62.2-63.5° C.

Hydrolysis of diethyl 2,2-bis(2-cyanoethyl)malonate

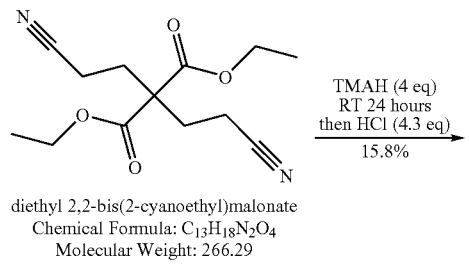

diethyl 2,2-bis(2-cyanoethyl)malonate
Chemical Formula: $C_{13}H_{18}N_2O_4$
Molecular Weight: 266.29

TMAH (4 eq)
RT 24 hours
then HCl (4.3 eq)
15.8%

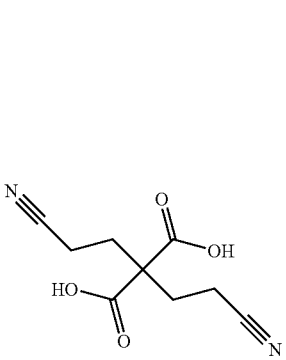

2,2-bis(2-cyanoethyl)malonic acid
Chemical Formula: $C_9H_{10}N_2O_4$
Molecular Weight: 210.19

Diethyl 2,2-bis(2-cyanoethyl)malonate (2 g, 7.51 mmol) was added to TMAH (25% in water, 10.95 g, 30.04 mmol) at room temperature. The mixture was stirred for 24 hours, and was then cooled to 0° C. A mixture of 12M HCl (2.69 cm³, 32.1 mmol) and ice (3 g) was added and the mixture was extracted with $CH_2Cl_2$ (5×50 cm³). The extracts were evaporated under vacuum to give 2,2-bis(2-cyanoethyl)malonic acid (0.25 g, 15.8%) as a colourless very viscous oil (lit decomposed. 158° C.).

Dicyanoethylation of glycine to give 2-(bis(2-cyanoethyl)amino)acetic acid

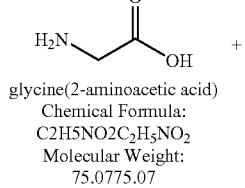

glycine(2-aminoacetic acid)
Chemical Formula: $C2H5NO2 C_2H_5NO_2$
Molecular Weight: 75.0775.07

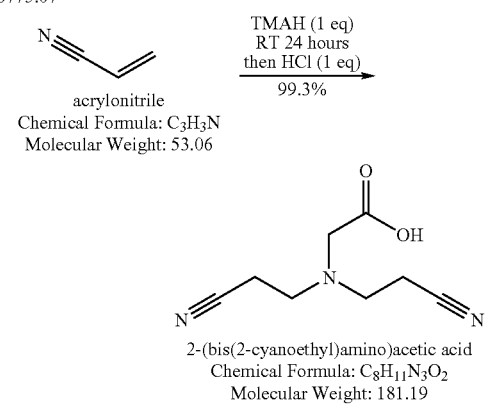

acrylonitrile
Chemical Formula: $C_3H_3N$
Molecular Weight: 53.06

TMAH (1 eq)
RT 24 hours
then HCl (1 eq)
99.3%

2-(bis(2-cyanoethyl)amino)acetic acid
Chemical Formula: $C_8H_{11}N_3O_2$
Molecular Weight: 181.19

Glycine (5 g, 67 mmol) was suspended in water (10 cm³) and TMAH (25% in water, 24.3 g, 67 mmol) was added slowly, keeping the temperature at <30° C. with an ice-bath. The mixture was then cooled to 10° C. and acrylonitrile (7.78 g, 146 mmol) was added. The mixture was stirred overnight, and allowed to warm to room temperature slowly. It was then heated at 50° C. for 2 hours, using a reflux condenser. After cooling with ice, the mixture was neutralized with HCl (6M, 11.1 cm³) and concentrated to a viscous oil. This was dissolved in acetone (100 cm³) and filtered to remove $NMe_4Cl$. The filtrate was concentrated under reduced pressure to give an oil that was treated once more with acetone (100 cm³) and filtered to remove more $NMe_4Cl$. Concentration of the filtrate gave 2-(bis(2-cyanoethyl)amino)acetic acid (11.99 g, 99.3%) as a colourless, viscous oil that crystallised over 1 week at room temperature to give a solid product, mp 73° C. (lit mp 77.8-78.8° C. Duplicate $^{13}C$ signals indicate a partly zwitterionic form in $CDCl_3$ solution.

When NaOH is used in the literature procedure, the NaCl formed is easier to remove and only one acetone treatment is necessary.

Dicyanoethylation of N-methyldiethanolamine to give 3,3'-(2,2'-(methylazanediyl)bis(ethane-2,1-diyl)bis(oxy)) dipropanenitrile

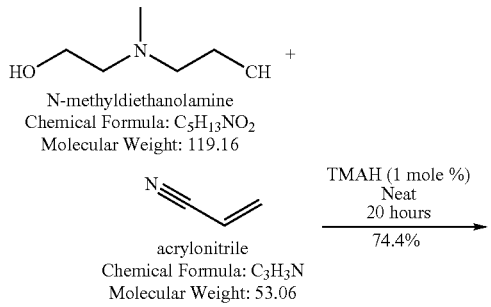

N-methyldiethanolamine
Chemical Formula: $C_5H_{13}NO_2$
Molecular Weight: 119.16 acrylonitrile
Chemical Formula: $C_3H_3N$
Molecular Weight: 53.06

TMAH (1 mole %)
Neat
20 hours
74.4%

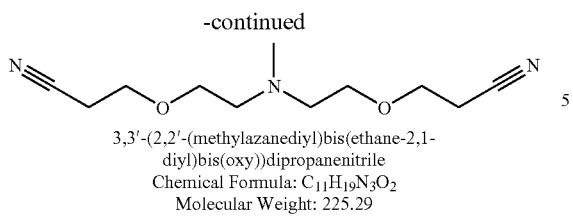

3,3'-(2,2'-(methylazanediyl)bis(ethane-2,1-diyl)bis(oxy))dipropanenitrile
Chemical Formula: $C_{11}H_{19}N_3O_2$
Molecular Weight: 225.29

To a cooled, stirred mixture of N-methyldiethanolamine (2 g, 17 mmol) and acrylonitrile (2.33 g, 42 mmol) was added TMAH (25% in water, 0.25 cm³, 0.254 g, 7 mmol). The mixture was then stirred overnight, and allowed to warm to room temperature slowly. It was then filtered through silica using a mixture of $Et_2O$ and $CH_2Cl_2$ (1:1, 250 cm³) and the filtrated was evaporated under reduced pressure to give 3,3'-(2,2'-(methylazanediyl)bis(ethane-2,1-diyl)bis(oxy))dipropanenitrile (2.85 g, 74.4%) as a colourless oil.

Dicyanoethylation of Glycine Anhydride

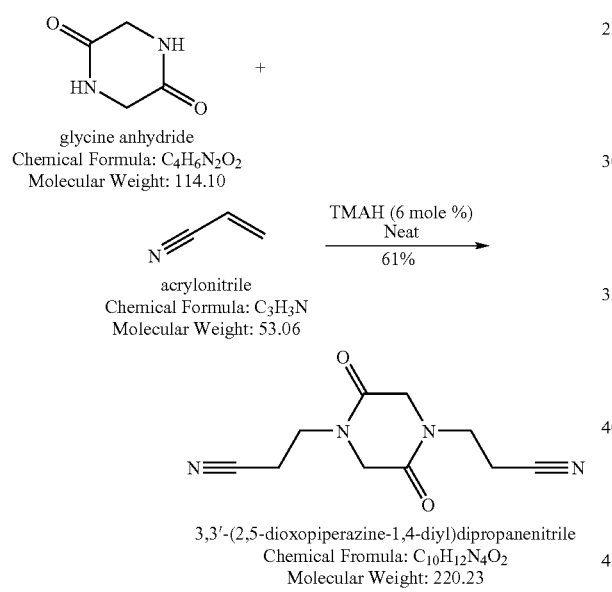

glycine anhydride
Chemical Formula: $C_4H_6N_2O_2$
Molecular Weight: 114.10

TMAH (6 mole %)
Neat
61% acrylonitrile
Chemical Formula: $C_3H_3N$
Molecular Weight: 53.06

3,3'-(2,5-dioxopiperazine-1,4-diyl)dipropanenitrile
Chemical Fromula: $C_{10}H_{12}N_4O_2$
Molecular Weight: 220.23

Glycine anhydride (2 g, 17.5 mmol) was mixed with acrylonitrile (2.015 g, 38 mmol) at 0° C. and TMAH (25% in water, 0.1 cm³, 0.1 g, 2.7 mmol) was added. The mixture was then stirred overnight, allowing it to warm to room temperature slowly. The solid formed was recrystallized from EtOH to give 3,3'-(2,5-dioxopiperazine-1,4-diyl)dipropanenitrile (2.35 g, 61%) as a white solid, mp 171-173° C. (lit mp 166° C.).

N,N-Dicyanoethylation of Acetamide

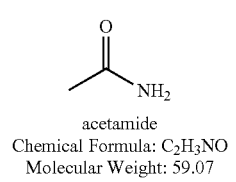

acetamide
Chemical Formula: $C_2H_3NO$
Molecular Weight: 59.07

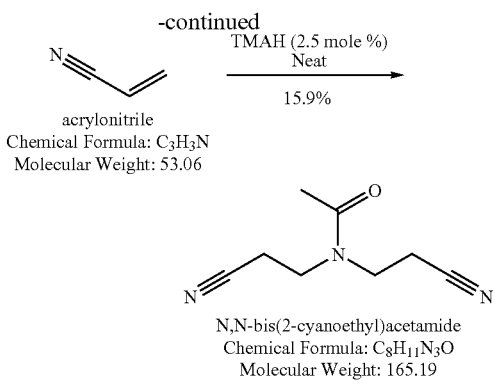

acrylonitrile
Chemical Formula: $C_3H_3N$
Molecular Weight: 53.06

TMAH (2.5 mole %)
Neat
15.9%

N,N-bis(2-cyanoethyl)acetamide
Chemical Formula: $C_8H_{11}N_3O$
Molecular Weight: 165.19

Acetamide (2 g, 33.9 mmol) was mixed with acrylonitrile (2.26 g, 42.7 mmol) at 0° C. and TMAH (25% in water, 0.06 cm³, 0.06 u, 1.7 mmol) was added. The mixture was then stirred overnight, allowing it to warm to room temperature slowly. The mixture was filtered through a pad of silica with the aid of $Et_2O/CH_2Cl_2$ (200 cm³) and the filtrate was concentrated under reduced pressure. The product was heated with spinning in a Kugelrohr at 150° C./2 mmHg to remove side products and to give N,N-bis(2-cyanoethyl)acetamide (0.89 g, 15.9%) as a viscous oil.

The N-substituent in the amides is non-equivalent due to amide rotation.

Tricyanoethylation of Ammonia $NH_3$ + ammonia
Chemical Formula: $H_3N$
Molecular Weight: 17.03 acrylonitrile
Chemical Formula: $C_3H_3N$
Molecular Weight: 53.06

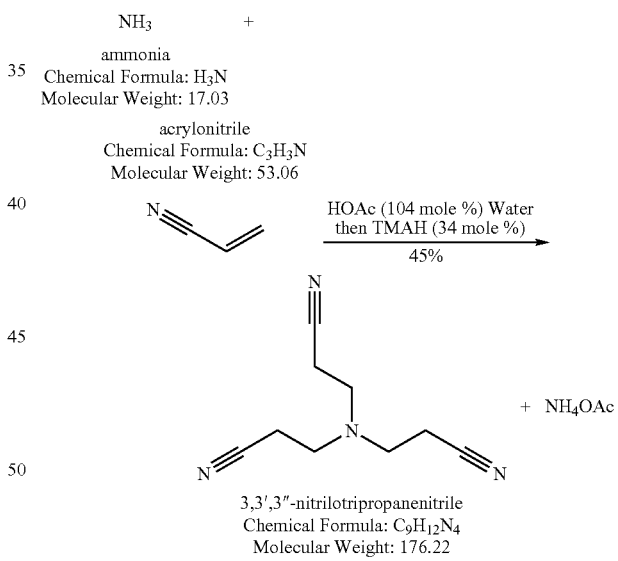

HOAc (104 mole %) Water
then TMAH (34 mole %)
45%

+ $NH_4OAc$ 3,3',3''-nitrilotripropanenitrile
Chemical Formula: $C_9H_{12}N_4$
Molecular Weight: 176.22

Ammonia (aq 35%, 4.29, 88 mmol) was added dropwise to ice-cooled AcOH (5.5 g, 91.6 mmol) in water (9.75 cm³), followed by acrylonitrile (4.65 g, 87.6 mol). The mixture was stirred under reflux for 3 days, after which it was cooled with ice and aq TMAH (25% in water, 10.94 g, 30 mmol) was added. The mixture was kept cooled with ice for 1 hours. The crystals formed was collected by filtration and washed with water. The product was dried in high vacuum to give 3,3',3''-nitrilotripropanenitrile (2.36 g, 45.8%) as a white solid, mp 59-61° C. (lit mp 59° C.).

When NaOH was used to neutralize the reaction (literature procedure), the yield was higher, 54.4%.

Dicyanoethylation of Cyanoacetamide

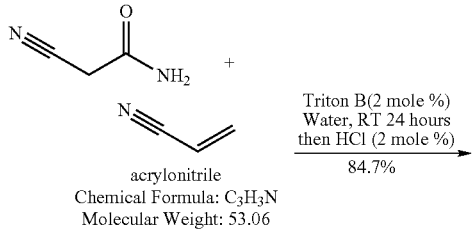

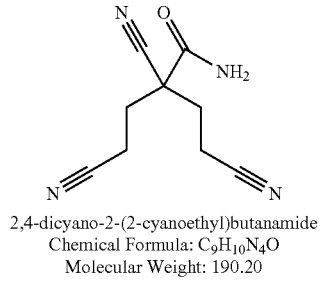

To a stirred mixture of cyanoacetamide (2.52 g, 29.7 mmol) and Triton B (40% in MeOH, 0.3 g, 0.7 mmol) in water (5 cm³) was added acrylonitrile (3.18 g, 59.9 mmol) over 30 minutes with cooling. The mixture was then stirred at room temperature for 30 min and then allowed to stand for 1 hours. EtOH (20g) and 1M HCl (0.7 cm³) were added and the mixture was heated until all solid had dissolved. Cooling to room temperature gave crystals that were collected by filtration and recrystallized from EtOH to give 2,4-dicyano-2-(2-cyanoethyl)butanamide (4.8 g, 84.7%) as a pale yellow solid, mp 118-120° C. (lit mp 118° C.).

N,N-Dicyanoethylation of Anthranilonitrile

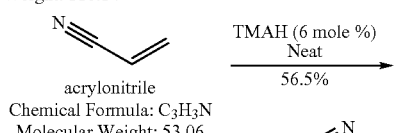

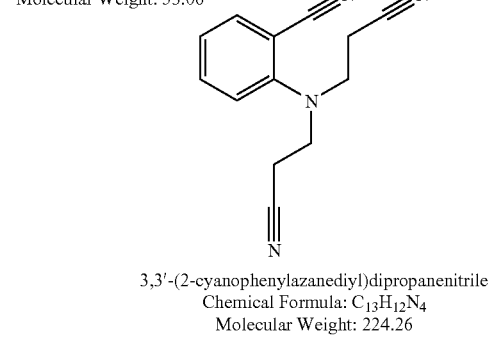

Anthranilonitrile (2 g, 16.9 mmol) was mixed with acrylonitrile (2.015 g, 38 mmol) at 0° C. and TMAH (25% in water, 0.1 cm³, 0.1 g, 2.7 mmol) was added. The mixture was then stirred overnight, allowing it to warm to room temperature slowly. The product was dissolved in $CH_2Cl_2$ and filtered through silica using a mixture of $Et_2O$ and $CH_2Cl_2$ (1:1, 250 cm³). The filtrate was evaporated to dryness and the solid product was recrystallised from EtOH (5 cm³) to give 3,3'-(2-cyanophenylazanediyl)dipropanenitrile (2.14 g, 56.5%) as an off-white solid, mp 79-82° C.

Dicyanoethylation of Malononitrile

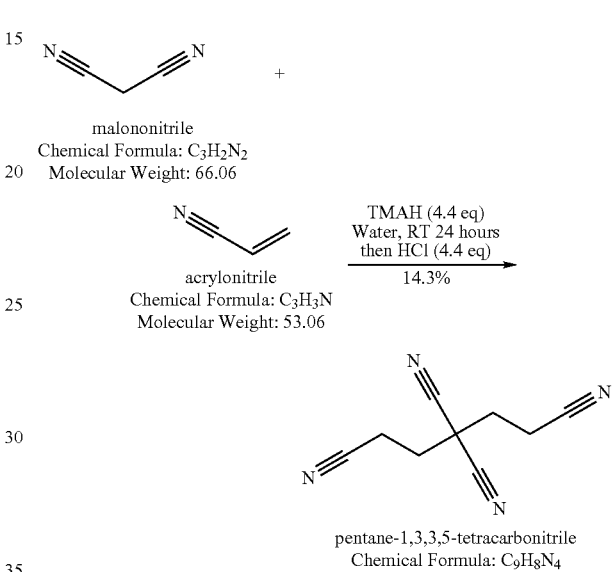

Malononitrile (5 g, 75.7 mmol) was dissolved in dioxane (10 cm³), followed by trimethylbenzylammonium hydroxide (Triton B, 40% in MeOH, 1.38 g, 3.3 mmol). The mixture was cooled while acrylonitrile (8.3 g, 156 mmol) was added. The mixture was stirred overnight, allowing it to warm to room temperature slowly. It was then neutralized with HCl (1 M, 3.3 cm³) and poured into ice-water. The mixture was extracted with $CH_2Cl_2$ (200 cm³) and the extracts were evaporated under reduced pressure. The product was purified by column chromatography (silica, 1:1 EtOAc-petroleum) followed by recrystallisation to give 1,3,3,5-tetracarbonitrile (1.86 g, 14.3%), mp 90-92° C. (lit mp 92° C.).

Tetracyanoethylation of Pentaerythritol

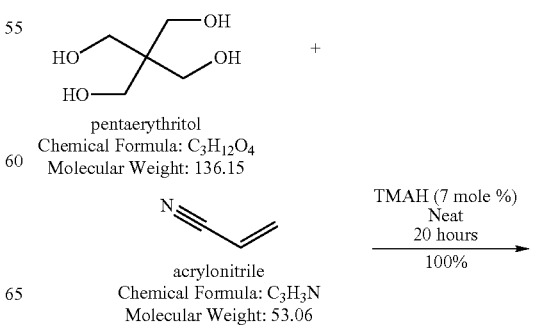

-continued

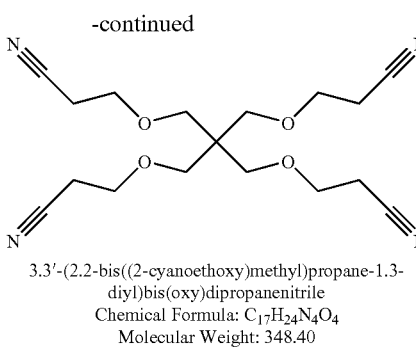

3,3'-(2,2-bis((2-cyanoethoxy)methyl)propane-1,3-diyl)bis(oxy)dipropanenitrile
Chemical Formula: $C_{17}H_{24}N_4O_4$
Molecular Weight: 348.40

Pentaerythritol (2 g, 14.7 mmol) was mixed with acrylonitrile (5 cm³, 4.03 g, 76 mmol) and the mixture was cooled in an ice-bath while tetramethylammonium hydroxide (=TMAH, 25% in water, 0.25 cm³, 0.254 g, 7 mmol) was added. The mixture was then stirred at room temperature for 20 hours. After the reaction time the mixture was filtered through silica using a mixture of Et₂O and CH₂Cl₂ (1:1, 250 cm³) and the filtrated was evaporated under reduced pressure to give 3,3'-(2,2-bis((2-cyanoethoxy)methyl)propane-1,3-diyl)bis(oxy)dipropanenitrile (5.12 g, 100%) as a colourless oil.

Hexacyanoethylation of Sorbitol

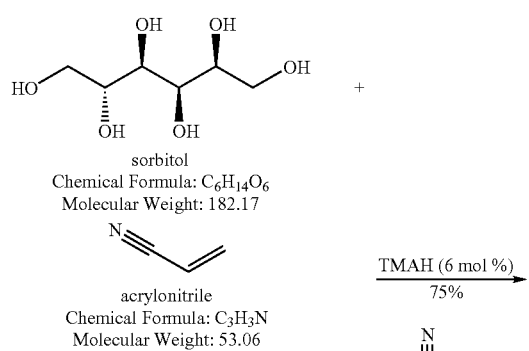

sorbitol
Chemical Formula: $C_6H_{14}O_6$
Molecular Weight: 182.17

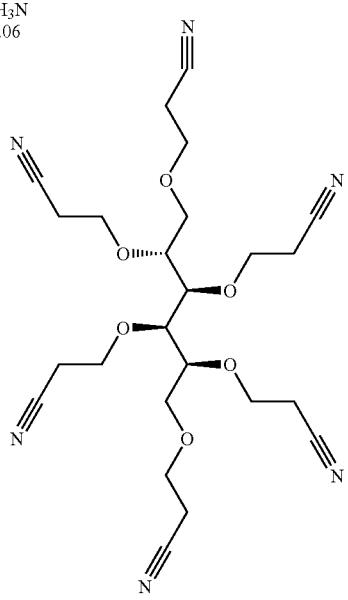

acrylonitrile
Chemical Formula: $C_3H_3N$
Molecular Weight: 53.06

TMAH (6 mol %)
———————→
75%

1,2,3,4,5,6-hexakis-O-(2-kyanoetyl)hexitol
Chemical Formula: $C_{24}H_{32}N_6O_6$
Molecular Weight: 500.55

Sorbitol (2 g, 11 mmol) was mixed with acrylonitrile (7 cm³, 5.64 g, 106 mmol) and the mixture was cooled in an ice-bath while tetramethylammonium hydroxide (=TMAH, 25% in water, 0.25 cm³, 0.254 g, 7 mmol) was added. The mixture was then stirred at room temperature for 48 hours, adding another 0.25 cm³ of TMAH after 24 hours. After the reaction time the mixture was filtered through silica using a mixture of Et₂O and CH₂Cl₂ (1:1, 250 cm³) and the filtrate was evaporated under reduced pressure to give a fully cyanoethylated product (4.12 g, 75%) as a colourless oil.

Tricyanoethylation of diethanolamine to give 3,3'-(2,2'-(2-cyanoethylazanediyl)bis(ethane-2,1-diyl)bis(oxy))dipropanenitrile

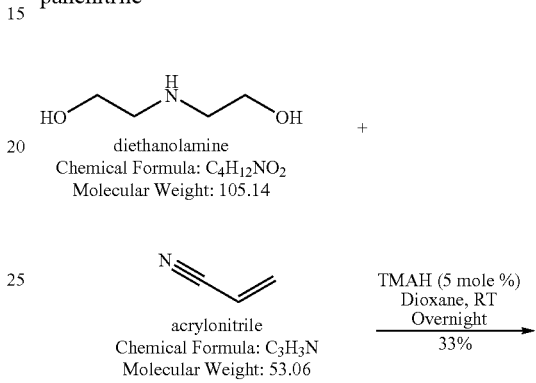

diethanolamine
Chemical Formula: $C_4H_{12}NO_2$
Molecular Weight: 105.14 acrylonitrile
Chemical Formula: $C_3H_3N$
Molecular Weight: 53.06

TMAH (5 mole %)
Dioxane, RT
Overnight
———————→
33%

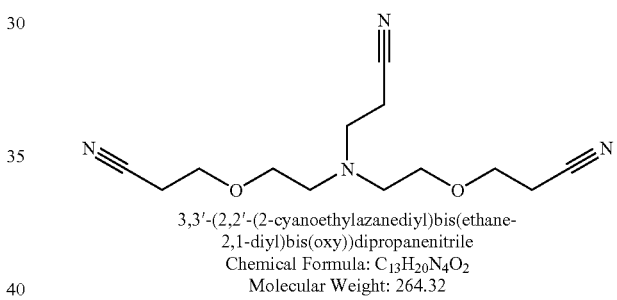

3,3'-(2,2'-(2-cyanoethylazanediyl)bis(ethane-2,1-diyl)bis(oxy))dipropanenitrile
Chemical Formula: $C_{13}H_{20}N_4O_2$
Molecular Weight: 264.32

To an ice-cooled stirred solution of diethanolamine (2 g, 19 mmol) and TMAH (25% in water, 0.34 cm³, 0.35 g, 9.5 mmol) in dioxane (5 cm³) was added acrylonitrile (3.53 g, 66.1 mmol) dropwise. The mixture was then stirred overnight, and allowed to warm to room temperature. More acrylonitrile (1.51 g, 28 mmol) and TMAH (0.25 cm³, 7 mmol) was added and stirring was continued for additional 24 h. The crude mixture was filtered through a pad of silica (Et₂O/CH₂Cl₂ as eluent) and evaporated to remove dioxane. The residue was purified by column chromatography (silica, Et₂O to remove impurities followed by EtOAc to elute product) to give 3,3'-(2,2'-(2-cyanoethylazanediyl)bis(ethane-2,1-diyl)bis(oxy))dipropanenitrile (1.67 g, 33%) as an oil.

Reactions to produce amidoxime compounds.

Reaction of acetonitrile to give N'-hydroxyacetimidamide

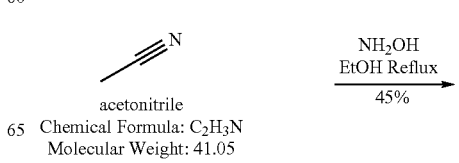

acetonitrile
Chemical Formula: $C_2H_3N$
Molecular Weight: 41.05

NH₂OH
EtOH Reflux
———————→
45%

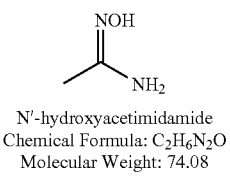

N'-hydroxyacetimidamide
Chemical Formula: C₂H₆N₂O
Molecular Weight: 74.08

A solution of acetonitrile (0.78 g, 19 mmol) and hydroxylamine (50% in water, 4.65 cm³, 5.02 g, 76 mmol, 4 eq) in EtOH (100 cm³) was stirred under reflux for 1 hours, after which the solvent was removed under reduced pressure and the residue was recrystallised from iPrOH to give the product N'-hydroxyacetimidamide (0.63 g, 45%) as a solid, mp 134.5-136.5° C.

Reaction of octanonitrile to give N'-hydroxyoctanimidamide

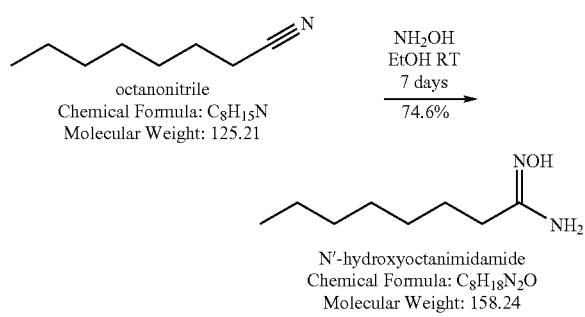

Octanonitrile (1 g, 7.99 mmol) and hydroxylamine (50% in water, 0.74 cm3, 0.79 a 12 mmol, 1.5 eq) in EtOH (1 cm³) were stirred at room temperature for 7 days. Water (10 cm³) was then added. This caused crystals to precipitate, these were collected by filtration and dried in high vacuum line to give the product N'-hydroxyoctanimidamide (0.94 g, 74.6%) as a white solid, mp 73-75° C.

Reaction of chloroacetonitrile to give 2-chloro-N'-hydroxyacetimidamide

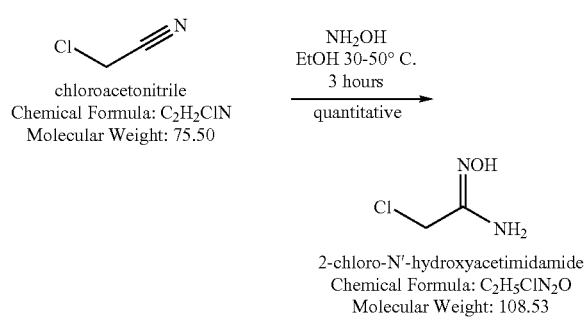

Chloroacetonitrile (1 g, 13 mmol) and hydroxylamine (50% in water, 0.89 cm³, 0.96 g, 14.6 mmol, 1.1 eq) in EtOH (1 cm³) were stirred at 30-50° C. for 30 min. The mixture was then extracted with Et2O (3×50 cm³). The extracts were evaporated under reduced pressure to give the product 2-chloro-N'-hydroxyacetimidamide (0.81 g, 57.4%) as a yellow solid, mp 79-80° C.

Reaction of ethyl 2-cyanoacetate to give 3-amino-N-hydroxy-3-(hydroxyimino)propanamide

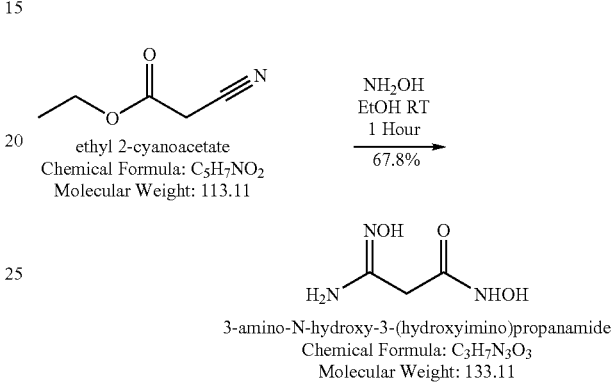

Ethyl cyanoacetate (1 g, 8.84 mmol) and hydroxylamine (50% in water, 1.19 cm3, 1.29 g, 19.4 mmol, 2.2 eq) in EtOH (1 cm ) were allowed to stand at room temperature for 1 hour with occasional swirling. The crystals formed were collected by filtration and dried in high vacuum line to give a colourless solid, 3-amino-N-hydroxy-3-(hydroxyimino)propanamide, mp 158° C. (decomposed) (lit mp 150° C.).

Reaction of 3-hydroxypropionitrile to give N',3-dihydroxypropanimidamide

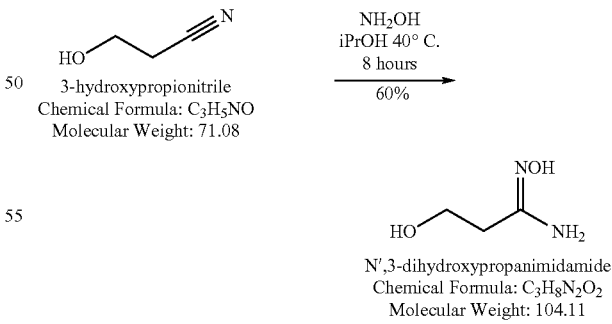

Equal molar mixture of 3-hydrxoypropionitrile and hydroxylamine heated to 40° C. for 8 hours with stirring. The solution is allowed to stand overnight yielding a fine slightly off white precipitate. The precipitated solid was filtered off and washed with iPrOH and dried to a fine pure white crystalline solid N',3-dihydroxypropanimidamide mp 94° C.

Reaction of 2-cyanoacetic acid to give isomers of 3-amino-3-(hydroxyimino)propanoic acid.

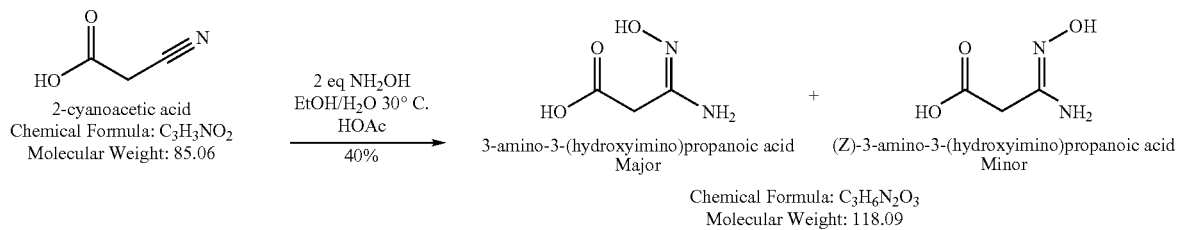

-Cyanoacetic acid (1 g, 11.8 mmol) was dissolved in EtOH (10 cm$^3$) and hydroxylamine (50% in water, 0.79 cm3, 0.85 g, 12.9 mmol, 1.1 eq) was added. The mixture was warmed at 40° C. for 30 min and the crystals formed (hydroxylammonium cyanoacetate) were filtered off and dissolved in water (5 cm$^3$). Additional hydroxylamine (50% in water, 0.79 cm$^3$, 0.85 g, 12.9 mmol, 1.1 eq) was added and the mixture was stirred at room temperature overnight. Acetic acid (3 cm$^3$) was added and the mixture was allowed to stand for a few hours. The precipitated solid was filtered off and dried in high vacuum line to give the product 3-amino-3-(hydroxyimino) propanoic acid (0.56 g, 40%) as a white solid, mp 136.5° C. (lit 144° C.) as two isomers.

Characterization of the product using FTIR and NMR are as follows: vmax(KBr)/cm-1 3500-3000 (br), 3188, 2764, 1691, 1551, 1395, 1356, 1265 and 1076; δH(300 MHz; DMSO-d6; Me4Si) 10.0-9.0 (br, NOH and COOH), 5.47 (2H, br s, NH2) and 2.93 (2H, s, CH2); δC(75 MHz; DMSO-d6; Me4Si) 170.5 (COOH minor isomer), 170.2 (COOH major isomer), 152.8 (C(NOH)NH2 major isomer) 148.0 (C(NOH)NH2 minor isomer), 37.0 (CH2 minor isomer) and 34.8 (CH2 major isomer).

Reaction of adiponitrile to give N'1,N'6-dihydroxyadipimidamide

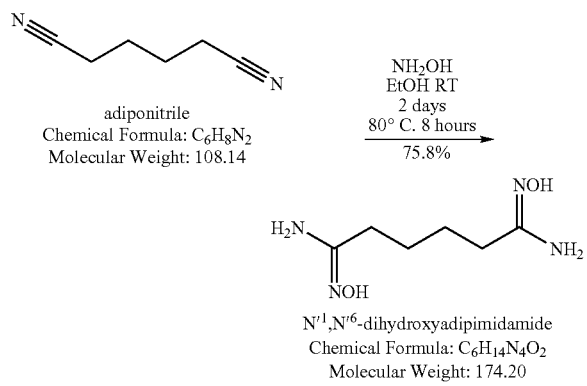

Adiponitrile (1 g, 9 mmol) and hydroxylamine (50%. in water, 1.24 cm3, 1.34 g, 20 mmol, 2.2 eq) in EtOH (10 cm3) were stirred at room temperature for 2 days and then at 80° C. for 8 hours. The mixture was allowed to cool and the precipitated crystals were collected by filtration and dried in high vacuum line to give the product N'1,N'6-dihydroxyadipimidamide (1.19 g, 75.8%) as a white solid, mp 160.5 (decomposed) (lit decomposed 168-170° C.

Reaction of sebaconitrile to give N'1,N'10-dihydroxydecanebis(imidamide)

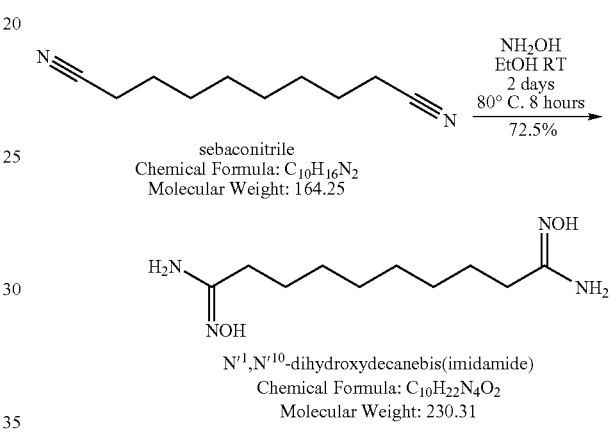

Sebaconitrile (1 g, 6 mmol) and hydroxylamine (50% in water, 0.85 cm$^3$, 0.88 g, 13.4 mmol, 2.2 eq) in EtOH (12 cm$^3$) were stirred at room temperature for 2 days and then at 80° C. for 8 h. The mixture was allowed to cool and the precipitated crystals were collected by filtration and dried in high vacuum line to give the product N'1,N'10-dihydroxydecanebis(imidamide) (1 g, 72.5%); mp 182° C.

Reaction of 2-cyanoacetamide to give 3-amino-3-hydroxyimino)propanamide

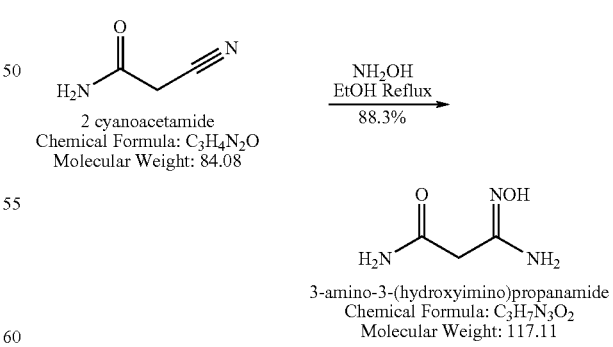

2-Cyanoacetamide (1 g, 11.9 mmol) and hydroxylamine (0.8 cm$^3$, 13 mmol, 1.1 eq) in EtOH (6 cm$^3$) were stirred under reflux for 2.5 hours. The solvents were removed under reduced pressure and the residue was washed with $CH_2Cl_2$ to give the product 3-amino-3-(hydroxyimino)propanamide (1.23 g, 88.3%) as a white solid, mp 159° C.

Reaction of glycolonitrile to give N',2-dihydroxyacetimidamide

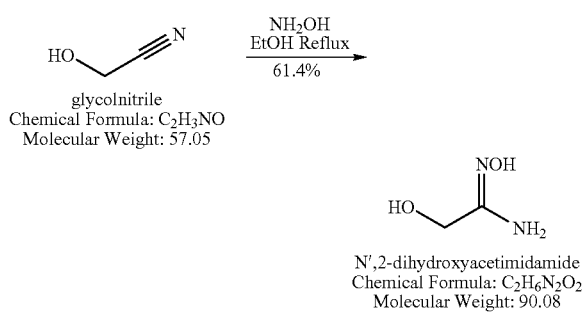

glycolnitrile
Chemical Formula: C$_2$H$_3$NO
Molecular Weight: 57.05

N',2-dihydroxyacetimidamide
Chemical Formula: C$_2$H$_6$N$_2$O$_2$
Molecular Weight: 90.08

Glycolonitrile (1 g, 17.5 mmol) and hydroxylamine (50% in water, 2.15 cm$^3$, 35 mmol, 2 eq) in EtOH (10 cm$^3$) were stirred under reflux for 6 hours and then at room temperature for 24 hours. The solvent was evaporated and the residue was purified by column chromatography (silica, 1:3 EtOH—CH$_2$Cl$_2$) to give the product N',2-dihydroxyacetimidamide (0.967 g, 61.4%) as an off-white solid, mp 63-65° C.

Reaction of 5-hexynenitrile to give 4-cyano-N'-hydroxybutanimidamide

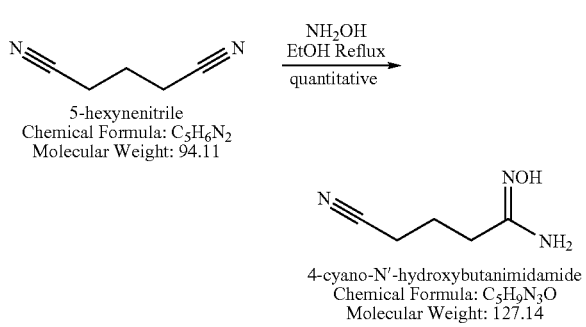

5-hexynenitrile
Chemical Formula: C$_5$H$_6$N$_2$
Molecular Weight: 94.11

4-cyano-N'-hydroxybutanimidamide
Chemical Formula: C$_5$H$_9$N$_3$O
Molecular Weight: 127.14

A solution of 5-hexynenitrile (0.93 g, 10 mmol) and hydroxylamine (50% in water, 1.22 cm$^3$, 20 mmol) was stirred under reflux for 10 hours, after which volatiles were removed under reduced pressure to give the product 4-cyano-N'-hydroxybutanimidamide (1.30 g, 100%) as a white solid, mp 99.5-101° C.

Reaction of iminodiacetonitrile to give 2,2'-azanediylbis(N'-hydroxyacetimidamide)

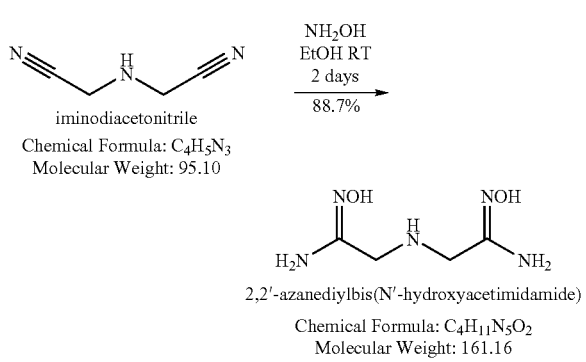

iminodiacetonitrile
Chemical Formula: C$_4$H$_5$N$_3$
Molecular Weight: 95.10

2,2'-azanediylbis(N'-hydroxyacetimidamide)
Chemical Formula: C$_4$H$_{11}$N$_5$O$_2$
Molecular Weight: 161.16

Commercial iminodiacetonitrile (Alfa-Aesar) was purified by dispersing the compound in water and extracting with dichloromethane, then evaporating the organic solvent from the extracts to give a white solid. Purified iminodiacetonitrile (0.82 g) and hydroxylamine (50% in water, 2.12 ml, 2.28 g, 34.5 mmol, 4 eq) in MeOH (6.9 ml) and water (6.8 ml) were stirred at room temperature for 48 hours. Evaporation of volatiles under reduced pressure gave a colorless liquid which was triturated with EtOH (40° C.) to give 2,2'-azanediylbis(N'-hydroxyacetimidamide) (1.23 g, 88.7%) as a white solid, mp 135-136° C, (lit m p 138° C.).

Reaction of 3-methylaminopropionitrile to give N'-hydroxy-3-(methylamino)propanimidamide

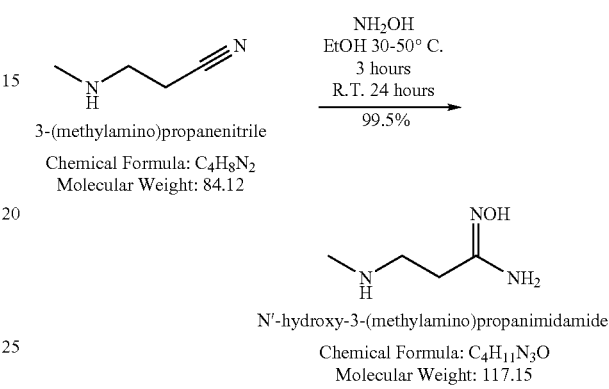

3-(methylamino)propanenitrile
Chemical Formula: C$_4$H$_8$N$_2$
Molecular Weight: 84.12

N'-hydroxy-3-(methylamino)propanimidamide
Chemical Formula: C$_4$H$_{11}$N$_3$O
Molecular Weight: 117.15

A solution of 3-methylaminopropionitrile (1 g, 11.9 mmol) and hydroxylamine (50% in water, 0.8 cm3, 0.864 g, 13.1 mmol, 1.1 eq) in EtOH (1 cm$^3$) was stirred at 30-50° C. for 3 hours and then at room temperature overnight. The solvent was removed under reduced pressure (rotary evaporator followed by high vacuum line) to give the product N'-hydroxy-3-(methylamino)propanimidamide (1.387 g, 99.5%) as a thick pale yellow oil.

Reaction of 3-(diethylamino)propanenitrile to give 3-(diethylamino)-N'-hydroxypropanimidamide

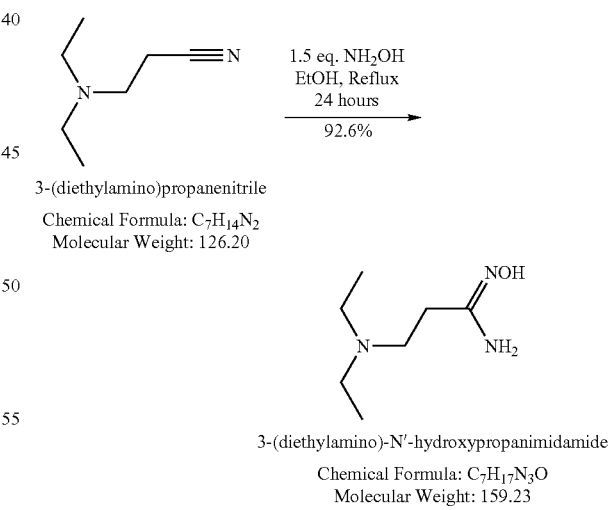

3-(diethylamino)propanenitrile
Chemical Formula: C$_7$H$_{14}$N$_2$
Molecular Weight: 126.20

3-(diethylamino)-N'-hydroxypropanimidamide
Chemical Formula: C$_7$H$_{17}$N$_3$O
Molecular Weight: 159.23

A solution of 3-(diethylamino)propanenitrile (1 g, 8 mmol) and NH$_2$OH (50% in water, 0.73 cm$^3$, 11.9 mmol) in EtOH (10·cm$^3$) were heated to reflux for 24 hours, after which the solvent and excess hydroxylamine were removed by rotary evaporator. The residue was freeze-dried and kept in high vacuum line until it slowly solidified to give give 3-(diethylamino)-N'-hydroxypropanimidamide (1.18 g, 92.6%) as a white solid, mp 52-54° C.

Reaction of 3,3',3''-nitrilotripropanenitrile with hydroxylamine to give 3,3',3''-nitrilotris(N'-hydroxypropanimidamide)

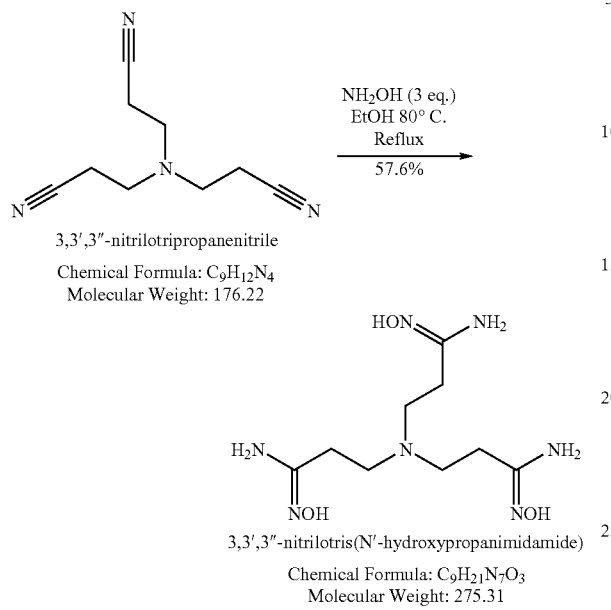

3,3',3''-nitrilotripropanenitrile
Chemical Formula: C₉H₁₂N₄
Molecular Weight: 176.22

3,3',3''-nitrilotris(N'-hydroxypropanimidamide)
Chemical Formula: C₉H₂₁N₇O₃
Molecular Weight: 275.31

A solution of 3,3',3''-nitrilotripropanenitrile (2 g, 11.35 mmol) and hydroxylamine (50% in water, 2.25 g, 34 mmol) in EtOH (25 cm³) was stirred at 80° C. overnight, then at room temperature for 24 hours. The white precipitate was collected by filtration and dried in high vacuum to give 3,3',3''-nitrilotris(N'-hydroxypropanimidamide) (1.80 g, 57.6%) as a white crystalline solid, mp 195-197° C. (decomposed).

Reaction of 3-(2-ethoxyethoxy)propanenitrile to give 3-(2-ethoxyethoxy)-N'-hydroxypropanimidamide

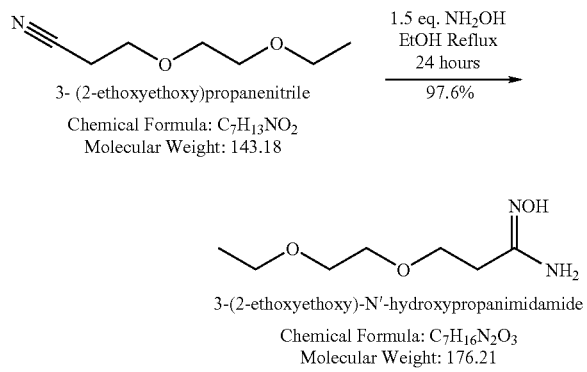

3- (2-ethoxyethoxy)propanenitrile
Chemical Formula: C₇H₁₃NO₂
Molecular Weight: 143.18

3-(2-ethoxyethoxy)-N'-hydroxypropanimidamide
Chemical Formula: C₇H₁₆N₂O₃
Molecular Weight: 176.21

A solution of 3-(2-ethoxyethoxy)propanenitrile (1 g, 7 mmol) and NH₂OH (50% in water, 0.64 cm³, 10.5 mmol) in EtOH (10 cm³) were heated to reflux for 24 hours, after which the solvent and excess hydroxylamine were removed by rotary evaporator. The residue was freeze-dried and kept in high vacuum line for several hours to give 3(2-ethoxyethoxy) N'-hydroxypropanimidamide (1.2 g, 97.6%) as a colourless oil.

Reaction of 3-(2-(2-(dimethylamino)ethoxy)ethoxy)propanenitrile to give 3-(2-(2-(dimethylamino)ethoxy)ethoxy)-N'-hydroxypropanimidamide

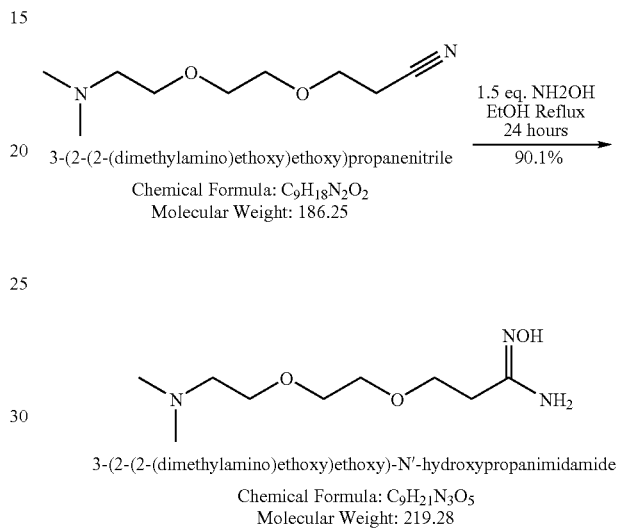

3-(2-(2-(dimethylamino)ethoxy)ethoxy)propanenitrile
Chemical Formula: C₉H₁₈N₂O₂
Molecular Weight: 186.25

3-(2-(2-(dimethylamino)ethoxy)ethoxy)-N'-hydroxypropanimidamide
Chemical Formula: C₉H₂₁N₃O₃
Molecular Weight: 219.28

A solution of 3-(2-(2-(dimethylamino)ethoxy)ethoxy)propanenitrile (0.5 g, 2.68 mmol) and NH₂OH (50% in water, 0.25 cm³, 4 mmol) in EtOH (10 cm³) were stirred at 80° C. for 24 hours, after which the solvent and excess hydroxylamine were removed by rotary evaporator. The residue was freeze-dried and kept in high vacuum line for several hours to give 3-(2-(2-(dimethylamino)ethoxy)ethoxy)-N'-hydroxypropanimidamide (0.53 g, 90.1%) as a light yellow oil.

Reaction of 3,3'-(2,2'-(2-cyanoethylazanediyl)bis(ethane-2,1-diyl)bis(oxy))dipropanenitrile with hydroxylamine to give 3,3'-(2,2'-(3-amino-3-(hydroxyimino)propylazanediyl) bis(ethane-2,1-diyl))bis(oxy)bis(N'-hydroxypropanimidamide)

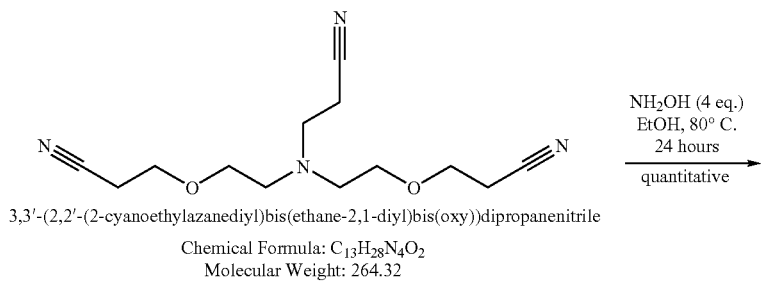

3,3'-(2,2'-(2-cyanoethylazanediyl)bis(ethane-2,1-diyl)bis(oxy))dipropanenitrile
Chemical Formula: C₁₃H₂₂N₄O₂
Molecular Weight: 264.32

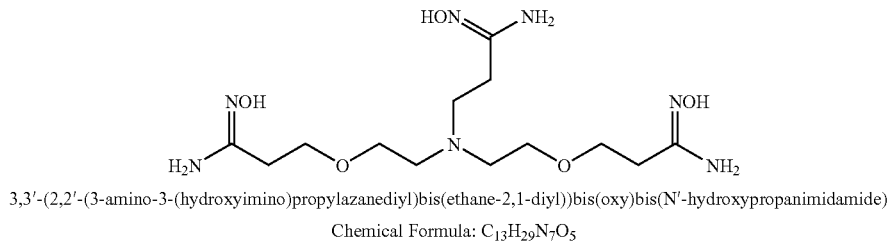

3,3'-(2,2'-(3-amino-3-(hydroxyimino)propylazanediyl)bis(ethane-2,1-diyl))bis(oxy)bis(N'-hydroxypropanimidamide)

Chemical Formula: $C_{13}H_{29}N_7O_5$
Molecular Weight: 363.41

Treatment of 3,3'-(2,2'-(2-cyanoethylazanediyl)bis(ethane-2,1-diyl)bis(oxy))dipropanenitrile (0.8 g, 3 mmol) with $NH_2OH$ (0.74 cm³, 12.1 mmol) in EtOH (8 cm³) gave 3,3'-(2,2'-(3amino-3-(hydroxyimino propylazanediyl)bis(ethane-2,1-diyl))bis(oxy)bis(N'-hydroxypropanimidamide) (1.09 g, 100%) as an oil.

Reaction of iminodipropionitrile to give 3,3'-azanediylbis (N'-hydroxypropanimidamide)

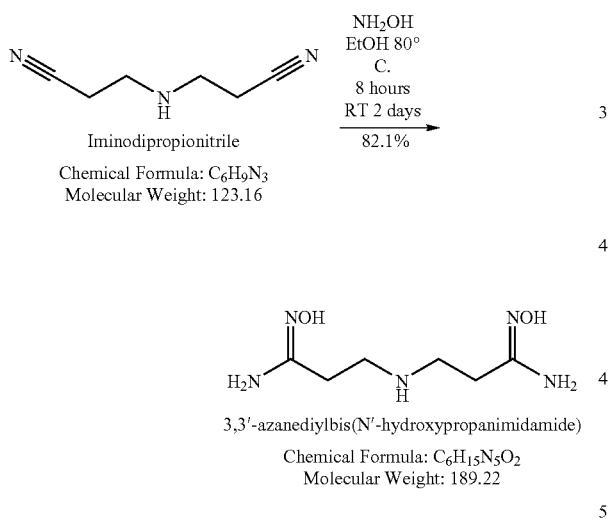

Iminodipropionitrile (1 g, 8 mmol) and hydroxylamine (50% in water, 1 cm³, 1.07 g, 16 mmol, 2 eq) in EtOH (8 cm³) were stirred at room temperature for 2 days and then at 80° C. for 8 hours. The mixture was allowed to cool and the precipitated crystals were collected by filtration and dried in high vacuum line to give the product 3,3'-azanediylbis(N'-hydroxypropanimidamide) (1.24 g, 82.1%) as a white solid, mp 180° C. (lit 160° C.

Reaction of 3,3',3'',3'''-(ethane-1,2-diylbis(azanetriyl))tetrapropanenitrile to give 3,3',3'',3'''-(ethane-1,2diyl bis(azanetriyl))tetrakis(N'-hydroxypropanimidamide) to produce EDTA analogue

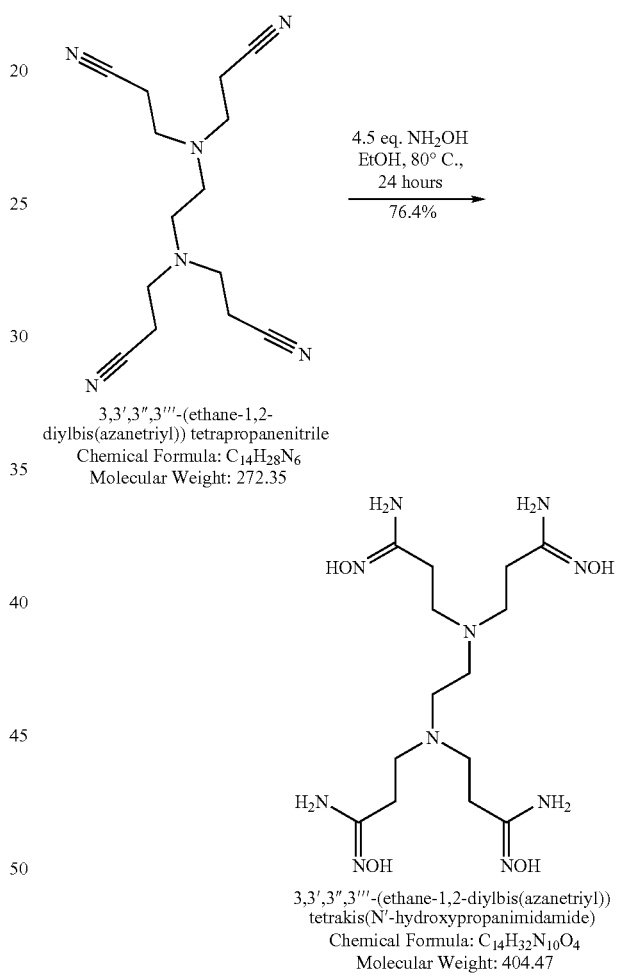

A solution of 3,3',3'',3'''-(ethane-1,2-diylbis(azanetriyl)) tetrapropanenitrile (1 g, 4 mmol) and $NH_2OH$ (50% in water, 1.1 cm³, 18.1 mmol) in EtOH (10 cm³) was stirred at 80° C. for 24 hours and was then allowed to cool to room temperature. The solid formed was collected by filtration and dried under vacuum to give 3,3',3'',3'''-(ethane-1,2-diylbis(azanetriyl))tetrakis(N'-hydroxypropanimidamide) (1.17 g, 76.4%) as a white solid, mp 191-192° C.

Reaction of 3,3'-(2,2-bis((2-cyanoethoxy)methylpropane-1,3-diyl)bis(oxy)dipropanenitrile with hydroxylamine to give 3,3'-(2,2-bis((3-(hydroxyamino)-3-iminopropoxy)methyl)propane-1,3-diyl)bis(oxy)bis(N-hydroxypropanimidamide)

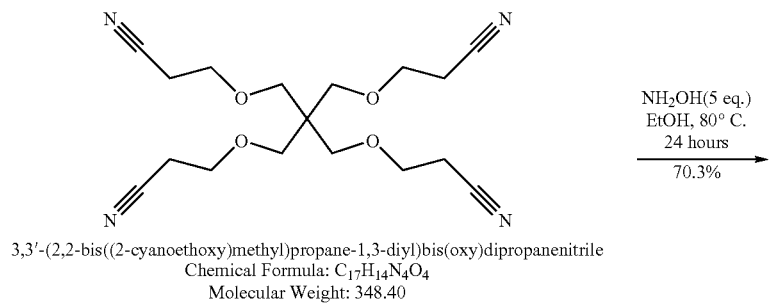

3,3'-(2,2-bis((2-cyanoethoxy)methyl)propane-1,3-diyl)bis(oxy)dipropanenitrile
Chemical Formula: $C_{17}H_{14}N_4O_4$
Molecular Weight: 348.40

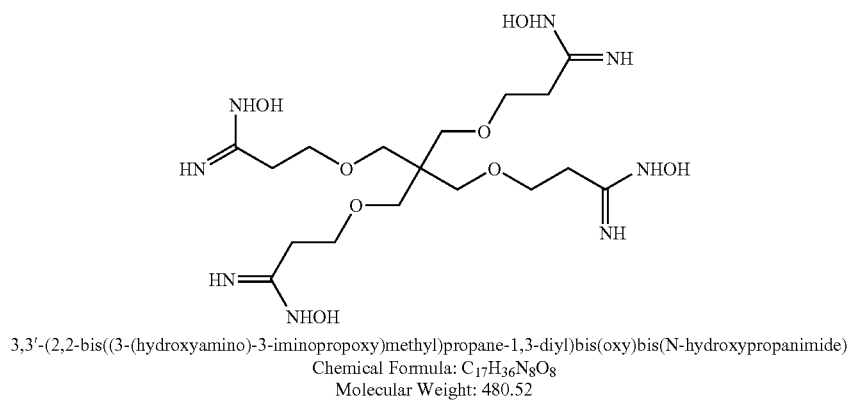

3,3'-(2,2-bis((3-(hydroxyamino)-3-iminopropoxy)methyl)propane-1,3-diyl)bis(oxy)bis(N-hydroxypropanimide)
Chemical Formula: $C_{17}H_{36}N_8O_8$
Molecular Weight: 480.52

To a solution of 3,3'-(2,2-bis((2-cyanoethoxy)methyl)propane-1,3-diyl)bis(oxy)dipropanenitrile (1 g, 2.9 mmol) in EtOH (10 ml) was added NH2OH (50% in water, 0.88 ml, 0.948 g, 14.4 mmol), the mixture was stirred at 80° C. for 24 hours and was then cooled to room temperature. Evaporation of the solvent and excess NH2OH in the rotary evaporator followed by high vacuum for 12 hours gave 3,3'-(2,2-his((3-(hydroxyamino)-3-iminopropoxy)methyl)propane-1,3-diyl)bis(oxy)bis(N-hydroxypropanimidamide) (0.98 g, 70.3%) as a white solid, mp 60° C.

Reaction of 3,3'-(2-cyanophenylazanediyl)dipropanenitrile with hydroxylamine to give 3,3'-(2-(N'-hydroxycarbamimidoyl)phenylazanediyl)bis(N'-hydroxypropanimidamide)

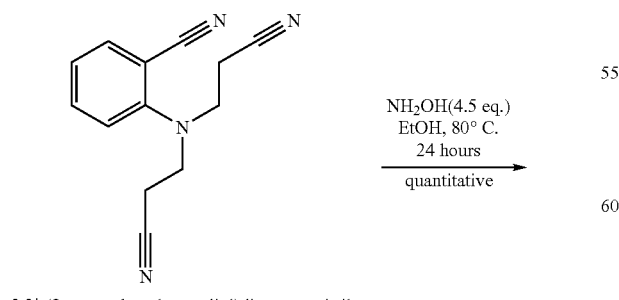

3,3'-(2-cyanophenylazanediyl)dipropanenitrile
Chemical Formula: $C_{13}H_{12}N_4$
Molecular Weight: 224.26

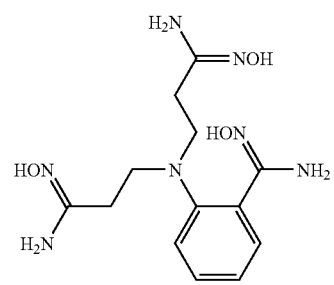

3,3'-(2-(N'-hydroxycarbamimidoyl)phenylazanediyl)bis(N'-hydroxypropanimidamide)

Chemical Formula: $C_{13}H_{21}N_7O_3$
Molecular Weight: 323.35

Treatment of 3,3'-(2-cyanophenylazanediyl)dipropanenitrile (1 g, 4.46 mmol) with NH2OH (1.23 ml. 20 mmol) in EtOH (10 ml) gave a crude product that was triturated with $CH_2Cl_2$ to give 3,3'-(2-(N'-hydroxycarbamimidoyl)phenylazanediyl)bis(N'-hydroxypropanimidamide) (1.44 g, 100%) as a solid, decomposed. 81° C.

Reaction of N,N-bis(2-cyanoethyl)acetamide with hydroxylamine to give N,N-bis(3-amino-3-(hydroxyimino)propyl)acetamide

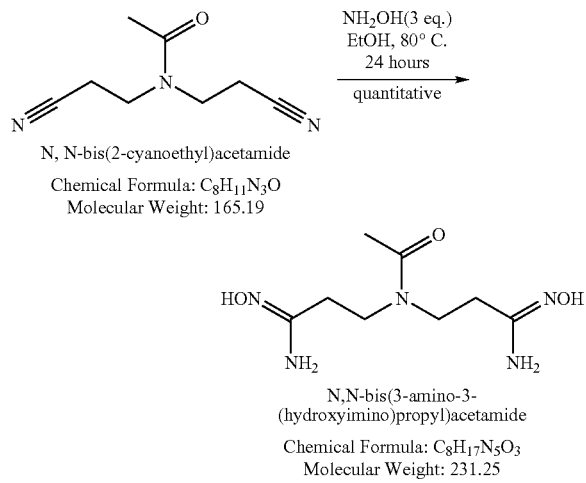

N,N-bis(2-cyanoethyl)acetamide
Chemical Formula: $C_8H_{11}N_3O$
Molecular Weight: 165.19

N,N-bis(3-amino-3-(hydroxyimino)propyl)acetamide
Chemical Formula: $C_8H_{17}N_5O_3$
Molecular Weight: 231.25

Treatment of N,N-bis(2-cyanoethyl)acetamide (0.5 g, 3.03 mmol) with $NH_2OH$ (0.56 ml, 9.1 mmol) in EtOH (5 ml) gave N,N-bis(3-amino-3-(hydroxyimino)propyl)acetamide (0.564 g, 100%) as a white solid, mp 56.4-58° C.

Reaction of 3,3'-(2,2'-(methylazanediyl)bis(ethane-2,1-diyl)bis(oxy))dipropanenitrile with hydroxylamine to give 3,3'-(2,2'-(methylazanediyl)bis(ethane-2,1-diyl)bis(oxy))bis(N'-hydroxypropanimidamide)

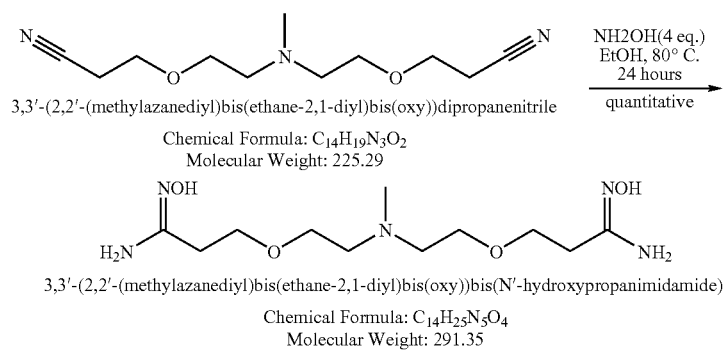

3,3'-(2,2'-(methylazanediyl)bis(ethane-2,1-diyl)bis(oxy))dipropanenitrile
Chemical Formula: $C_{14}H_{19}N_3O_2$
Molecular Weight: 225.29

3,3'-(2,2'-(methylazanediyl)bis(ethane-2,1-diyl)bis(oxy))bis(N'-hydroxypropanimidamide)
Chemical Formula: $C_{14}H_{25}N_5O_4$
Molecular Weight: 291.35

Treatment of 3,3'-(2,2'-(methylazanediyl)bis(ethane-2,1-diyl)bis(oxy))dipropanenitrile (1 g, 4,4 mmol) with $NH_2OH$ (0.82 ml, 13.3 mmol) in EtOH (10 ml) gave 3,3'-(2,2'-(methylazanediyl)bis(ethane-2,1-diyl)bis(oxy))bis(N'-hydroxypropanimidamide) (1.28 g, 100%) as an oil.

Reaction of glycol derivative 3,3'-(ethane-1,2-diylbis(oxy))dipropanenitrile to give 3,3'-(ethane-1,2-diylbis(oxy))bis(N'-hydroxypropanimidamide)

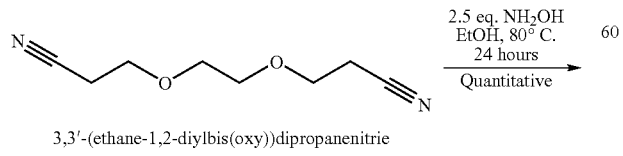

3,3'-(ethane-1,2-diylbis(oxy))dipropanenitrile
Chemical Formula: $C_8H_{12}N_2O_2$
Molecular Weight: 168.19

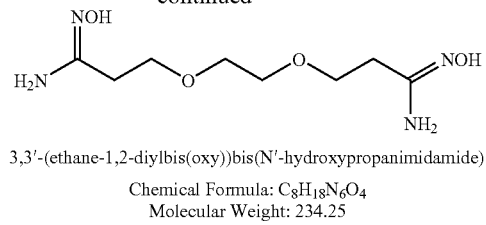

3,3'-(ethane-1,2-diylbis(oxy))bis(N'-hydroxypropanimidamide)
Chemical Formula: $C_8H_{18}N_6O_4$
Molecular Weight: 234.25

A solution of 3,3'-(ethane-1,2-diylbis(oxy))dipropanenitrile (1 g, 5 mmol) and $NH_2OH$ (50% in water, 0,77 cm$^3$, 12.5 mmol) in EtOH (10 cm$^3$) was stirred at 80° C. for 24 hours and then at room temperature for 24 hours. The solvent and excess $NH_2OH$ were evaporated off and the residue was freeze-dried to give 3,3'-(ethane-1,2-diylbis(oxy))bis(N'-hydroxypropanimidamide) (1.33 g, 100%) as a viscous oil.

Reaction of 3,3'-(piperazine-1,4-diyl)dipropanenitrile to give 3,3'-(piperazine-1,4-diy)bis(N'-hydroxypropanimidamide)

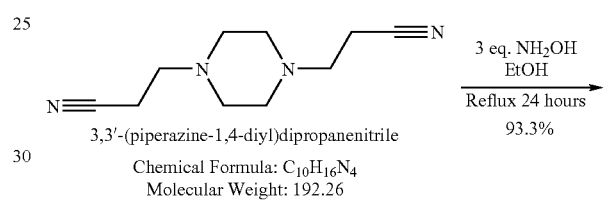

3,3'-(piperazine-1,4-diyl)dipropanenitrile
Chemical Formula: $C_{10}H_{16}N_4$
Molecular Weight: 192.26

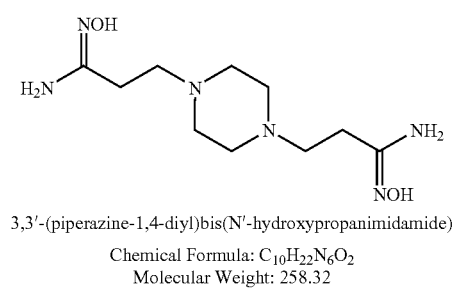

3,3'-(piperazine-1,4-diyl)bis(N'-hydroxypropanimidamide)
Chemical Formula: $C_{10}H_{22}N_6O_2$
Molecular Weight: 258.32

A solution of 3,3'-(piperazine-1,4-diyl)dipropanenitrile (1 g, 5.2 mmol) and $NH_2OH$ (50% in water, 0.96 cm$^3$, 15.6 mmol) in EtOH (10 cm³) were heated to reflux for 24 hours, after which the mixture was allowed to cool to room temperature. The solid formed was collected by filtration and dried in high vacuum line to give 3,3'-(piperazine-1,4-diyl)bis(N'-hydroxypropanimidamide) (1.25 g, 93.3%) as a white solid, decp 238° C. (brown colouration at >220° C.

Reaction of cyanoethylated sorbitol compound with hydroxylamine to give 1,2,3,4,5,6-hexakis-O-[3-(hydroxyamino)-3-iminopropyl Hexitol Reaction of Benzonitrile to give N'-hydroxybenzimidamide

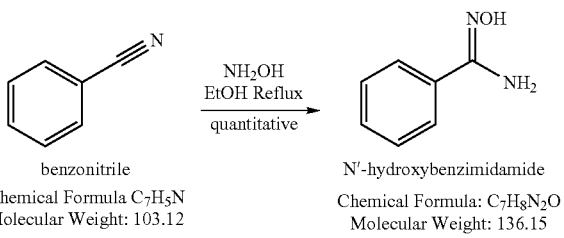

benzonitrile
Chemical Formula C₇H₅N
Molecular Weight: 103.12

N'-hydroxybenzimidamide
Chemical Formula: C₇H₈N₂O
Molecular Weight: 136.15

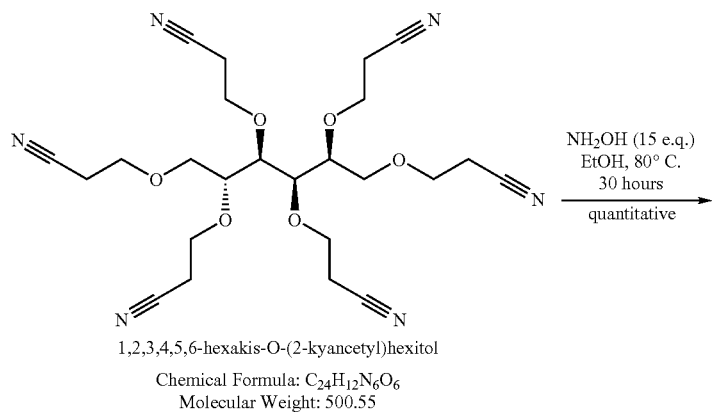

1,2,3,4,5,6-hexakis-O-(2-kyancetyl)hexitol
Chemical Formula: $C_{24}H_{12}N_6O_6$
Molecular Weight: 500.55

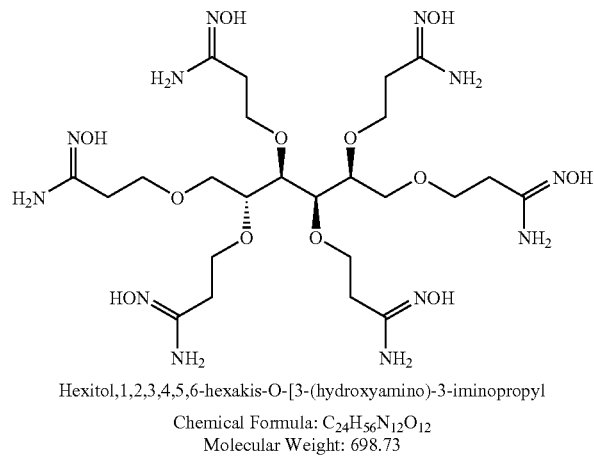

Hexitol,1,2,3,4,5,6-hexakis-O-[3-(hydroxyamino)-3-iminopropyl
Chemical Formula: $C_{24}H_{56}N_{12}O_{12}$
Molecular Weight: 698.73

A solution of cyanoethylated product of sorbitol (0.48 g, 0.96 mmol) and NH₂OH (50% in water, 0.41 ml, 0.44 g, 6.71 mmol) in EtOH (5 ml) was stirred at 80° C. for 24 hours. Evaporation of solvent and NMR analysis of the residue showed incomplete conversion. The product was dissolved in water (10 ml) and EtOH (100 ml) and NH₂OH (0.5 g, 7.6 mmol) was added. The mixture was stirred at 80° C. for a further 7 hours. Removal of all volatiles after the reaction gave 1,2,3,4,5,6-hexakis-O-[3-(hydroxyamino)-3-iminopropyl Hexitol, (0.67 g, 100%) as a white solid, mp 92-94° C. (decomposed).

Benzonitrile (0.99 cm³, 1 g, 9.7 mmol) and hydroxylamine (50% in water, 0.89 cm³, 0.96 g, 14.55 mmol, 1.5 eq) were stirred under reflux in EtOH (10 cm³) for 48 hours. The solvent was evaporated under reduced pressure and water (10 cm³) was added to the residue. The mixture was extracted with dichloromethane (100 cm³) and the organic extract was evaporated under reduced pressure. The residue was purified by column chromatography to give the product N'-hydroxybenzimidamide (1.32 g, 100%) as a white crystalline solid, mp 79-81° C. (lit 79-80° C. This procedure is suitable for all starting materials bearing a benzene ring.

Reaction of 3-phenylpropionitrile to give N'-hydroxy-3-phenylpropanimidamide

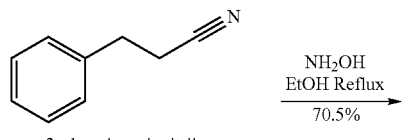

3-phenylpropionitrile
Chemical Formula: C₉H₉N
Molecular Weight: 131.17

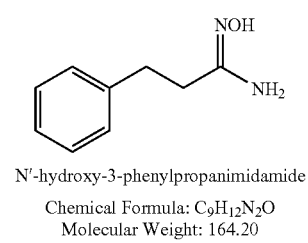

N'-hydroxy-3-phenylpropanimidamide
Chemical Formula: C₉H₁₂N₂O
Molecular Weight: 164.20

Phenylpropionitrile (1 g, 7.6 mmol) was reacted with hydroxylamine (50% in water, 0.94 cm³, 15.2 mmol, 2 eq) in EtOH (7.6 cm³) in the same manner as in the preparation of N'-hydroxybenzimidamide (EtOAc used in extraction) to give the product N'-hydroxy-3-phenylpropanimidamide (0.88 g, 70.5%) as a white solid, mp 42-43° C.

Reaction of m-tolunitrile to give N'-hydroxy-3-methylbenzimidamide

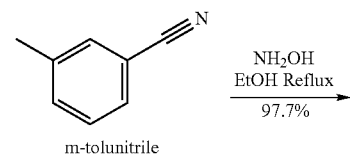

m-tolunitrile
Chemical Formula: C₈H₇N
Molecular Weight: 117.15

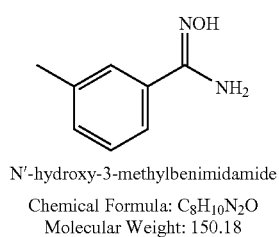

N'-hydroxy-3-methylbenimidamide
Chemical Formula: C₈H₁₀N₂O
Molecular Weight: 150.18

The reaction of m-tolunitrile (1 g, 8.54 mmol) and hydroxylamine (0.78 cm³, 12.8 mmol, 1.5 eq) in EtOH (8.5 cm³) was performed in the same manner as in the preparation of N'-hydroxybenzimidamide, to give the product N'-hydroxy-3-methylbenzimidamide (1.25 g, 97.7%) as a white solid, mp 92° C. (lit 88-90° C.).

Reaction of benzyl cyanide to give N'-hydroxy-2-phenylacetimidamide

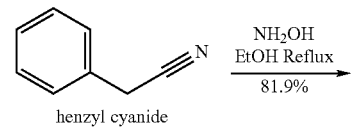

henzyl cyanide
Chemical Formula: C₈H₇N
Molecular Weight: 117.15

-continued

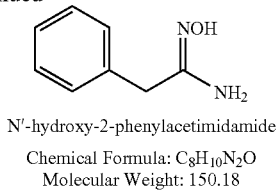

N'-hydroxy-2-phenylacetimidamide
Chemical Formula: C₈H₁₀N₂O
Molecular Weight: 150.18

Benzyl cyanide (1 g, 8.5 mmol) and hydroxylamine (50% in water, 1.04 cm³, 17 mmol, 2 eq) in EtOH (8.5 cm³) were reacted in the same manner as in the preparation of N'-hydroxybenzimidamide (EtOAc used in extraction) to give the product N'-hydroxy-2-phenylacetimidamide (1.04 g, 81.9%) as a pale yellow solid, mp 63.5-64.5° C. (lit 57-59° C.).

Reaction of Anthranilonitrile to give 2-amino-N'-hydroxybenzimidamide

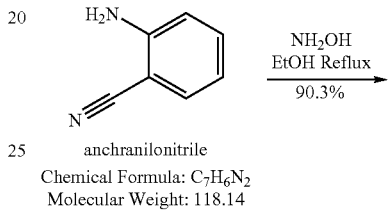

anchranilonitrile
Chemical Formula: C₇H₆N₂
Molecular Weight: 118.14

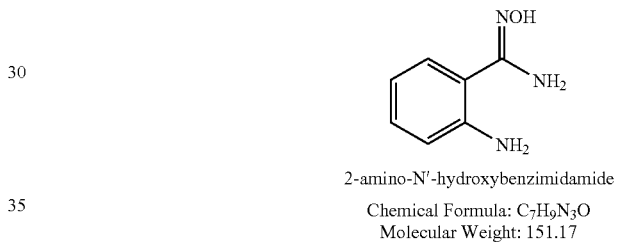

2-amino-N'-hydroxybenzimidamide
Chemical Formula: C₇H₉N₃O
Molecular Weight: 151.17

Anthranilonitrile (1 g, 8,5 mmol) and hydroxylamine (50% in water, 0.57 cm³, 9.3 mmol, 1.1 eq) in EtOH (42.5 cm³) were stirred under reflux for 24 hours, after which the volatiles were removed under reduced pressure and residue was partitioned between water (5 cm³) and CH₂Cl₂ (100 cm³). The organic phase was evaporated to dryness in the rotary evaporator followed by high vacuum line to give the product 2-amino-N'-hydroxybenzimidamide (1.16 g, 90.3%) as a solid, mp 85-86° C.

Reaction of phthalonitrile to give isoindoline-1,3-dione dioxime

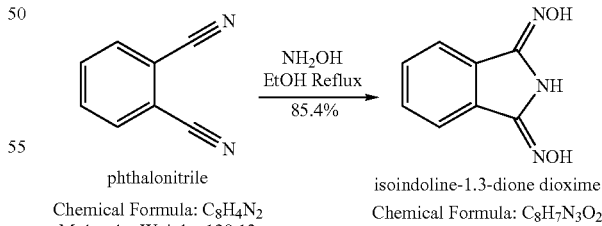

phthalonitrile
Chemical Formula: C₈H₄N₂
Molecular Weight: 128.13 isoindoline-1.3-dione dioxime
Chemical Formula: C₈H₇N₃O₂
Molecular Weight: 177.16

Phthalonitrile (1 g, 7.8 mmol) and hydroxylamine (1.9 cm³, 31.2 mmol, 4 eq) in EtOH (25 cm³) were stirred under reflux for 60 hours, after which the volatiles were removed under reduced pressure and the residue was washed with EtOH (2 cm³) and CH₂Cl₂ (2 cm³) to give the cyclised product isoindoline-1,3-dione dioxime (1.18 g, 85.4%) as a pale yellow solid, mp 272-275° C. (decomposed) (lit 271° C.).

Reaction of 2-cyanophenylacetonitrile to give the cyclised product 3-aminoisoquinolin-1(4H)-one oxime or 3-(hydroxyamino)-3,4-dihydroisoquinolin-1-amine

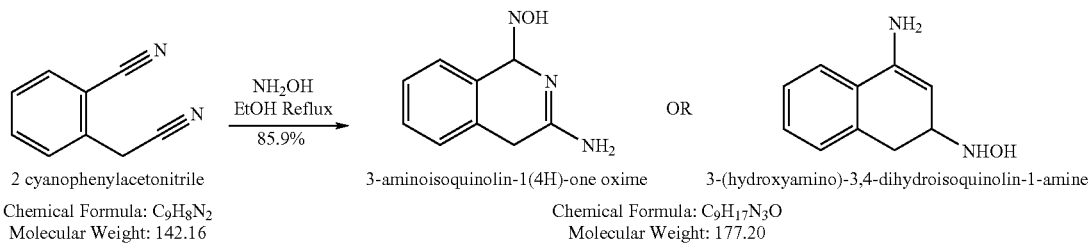

2 cyanophenylacetonitrile
Chemical Formula: C₉H₈N₂
Molecular Weight: 142.16

3-aminoisoquinolin-1(4H)-one oxime            3-(hydroxyamino)-3,4-dihydroisoquinolin-1-amine
Chemical Formula: C₉H₁₇N₃O
Molecular Weight: 177.20

A solution of 2-cyanophenylacetonitrile (1 g, 7 mmol) and hydroxylamine (1.7 cm³, 28.1 mmol, 4 eq) in EtOH (25 cm³) were stirred under reflux for 60 hours, after which the volatiles were removed under reduced pressure. The residue was recrystallised from EtOH-water (1:4, 15 cm³) to give the cyclised product 3-aminoisoquinolin-1(4H)-one oxime or 3-(hydroxyamino)-3,4-dihydroisoquinolin-1-amine (1.15 g, 85.9%) as a solid, mp 9.25-94.5° C.

Reaction of cinnamonitrile to give N'-hydroxycinnamimidamide

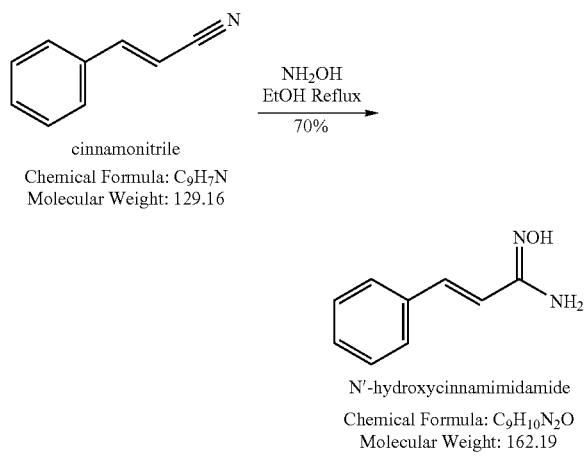

cinnamonitrile
Chemical Formula: C₉H₇N
Molecular Weight: 129.16

N'-hydroxycinnamimidamide
Chemical Formula: C₉H₁₀N₂O
Molecular Weight: 162.19

Cinnamonitrile (1 g, 7.74 mmol) and hydroxylamine (0.71 cm³, 11.6 mmol, 1.5 eq) were reacted in EtOH (7 cm³) as described for AO6 (two chromatographic separations were needed in purification) to give N'-hydroxycinnamimidamide (0.88 g, 70%) as a light orange solid, mp 85-87° C. (lit 93° C.).

Reaction of 5-cyanophthalide to give the product N'-hydroxy-1-oxo-1,3-dihydroisobenzofuran-5-carboximidamide

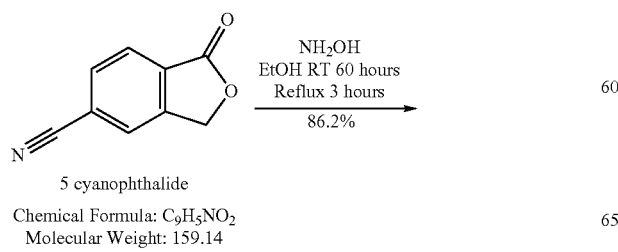

5 cyanophthalide
Chemical Formula: C₉H₅NO₂
Molecular Weight: 159.14

-continued

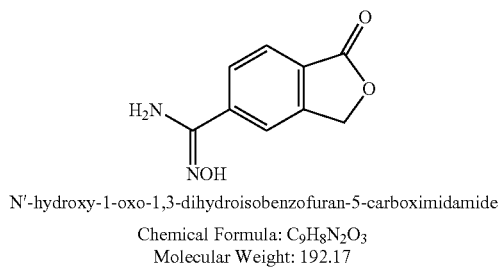

N'-hydroxy-1-oxo-1,3-dihydroisobenzofuran-5-carboximidamide
Chemical Formula: C₉H₈N₂O₃
Molecular Weight: 192.17

A solution of 5-cyanophthalide (1 g, 6.28 mmol) and hydroxylamine (50% in water, 0.77 cm³, 0.83 g, 12.6 mmol, 2 eq) in EtOH (50 cm³) was stirred at room temperature for 60 hours and then under reflux for 3 hours. After cooling to room temperature and standing overnight, the solid formed was collected by filtration and dried in high vacuum line to give the product N'-hydroxy-1-oxo-1,3-dihydroisobenzofuran-5-carboximidamide (1.04 g, 86.2%) as a white solid, mp 223-226° C. (decomposed).

Reaction of 4-chlorobenzonitrile to give the product 4-chloro-N'-hydroxybenzimidamide

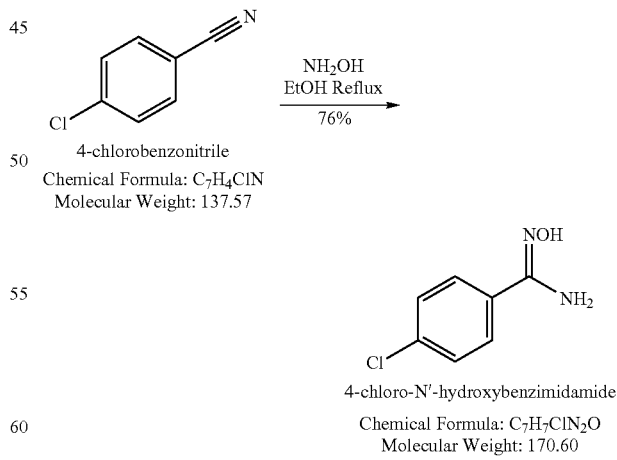

4-chlorobenzonitrile
Chemical Formula: C₇H₄ClN
Molecular Weight: 137.57

4-chloro-N'-hydroxybenzimidamide
Chemical Formula: C₇H₇ClN₂O
Molecular Weight: 170.60

A solution of 4-chlorobenzonitrile (1 g, 7.23 mmol) and hydroxylamine (50% in water, 0.67 cm³, 10.9 mmol, 1.5 eq) in EtOH (12.5 cm³) was stirred under reflux for 48 hours. The solvent was removed under reduced pressure and the residue was washed with CH$_2$Cl$_2$ (10 cm$^3$) to give the product 4-chloro-N'-hydroxybenzimidamide (0.94 g, 76%) as a white solid, mp 133-135° C.

Reaction of 3-(phenylamino)propanenitrile to give N'-hydroxy-3-(phenylamino)propanimidamide

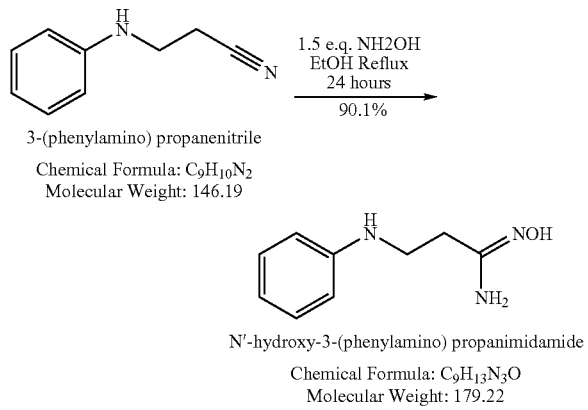

3-(phenylamino) propanenitrile
Chemical Formula: C$_9$H$_{10}$N$_2$
Molecular Weight: 146.19

N'-hydroxy-3-(phenylamino) propanimidamide
Chemical Formula: C$_9$H$_{13}$N$_3$O
Molecular Weight: 179.22

A solution of 3-(phenylamino)propanenitrile (1 g, 6.84 mmol) and NH$_2$OH (50% in water, 0.63 cm$^3$, 10.26 mmol) in EtOH (10 cm$^3$) were heated to reflux for 24 hours, after which the solvent and excess hydroxylamine were removed by rotary evaporator. To the residue was added water (10 cm$^3$) and the mixture was extracted with CH$_2$Cl$_2$ (100 cm$^3$). The extracts were concentrated under reduced pressure and the residue was purified by column chromatography (silica, Et$_2$O) to give N'-hydroxy-3-(phenylamino)propanimidamide (0.77 g, 62.8%) as a white solid, mp 93-95° C. (lit mp 91-91.5° C.).

Reaction of 4-pyridlinecarbonitrile to give the product N'-hydroxyisonicotinimidamide

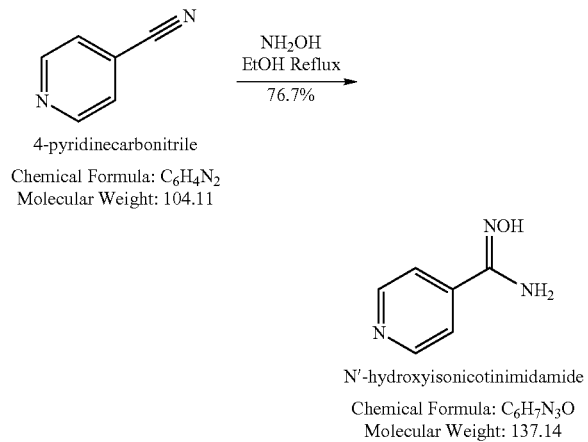

4-pyridinecarbonitrile
Chemical Formula: C$_6$H$_4$N$_2$
Molecular Weight: 104.11

N'-hydroxyisonicotinimidamide
Chemical Formula: C$_6$H$_7$N$_3$O
Molecular Weight: 137.14

Pyridinecarbonitrile (1 g, 9.6 mmol) and hydroxylamine (50% in water, 0.88 cm$^3$, 14.4 mmol, 1.5 eq) in EtOH (10 cm$^3$) were stirred under reflux for 18 hours, after which the volatiles were removed under reduced pressure and the residue was recrystallised from EtOH to give the product N'-hydroxyisonicotinimidamide (1.01 g, 76.7%) as a solid, mp 203-205° C.

In one embodiment, the amidoxime compound-based composition of this invention comprises one or more metals selected from the group consisting of aluminum, calcium, chromium, copper, iron, lead, magnesium, manganese, nickel, potassium, sodium, zinc and mixtures thereof. The metals in the total metal concentration may include other metals as well. However, the end applications of the composition may prescribe particular maximum concentrations of these other metals. The preceding list of metals is in alphabetical and not in order of preponderance or importance. It is common in the electronics industry to require that the chemicals they use meet low concentration limits for these metals published by the industry roadmap, i.e., the International Technology Roadmap for Semiconductors (ITRS Ropadmap).

The composition is generally in the form of a solution, preferably an aqueous solution. The concentration of the amidoxime compound in a solution composition can range 0.01%, based on the total weight of the composition up to the solubility limit of the acid in the solution. Preferably, the concentration of amidoxime compound is less than the solubility limit to avoid precipitation and/or crystallization of the amidoxime compound. Desirable ranges of concentration of the amidoxime compound in a solution composition of this invention are from 50% to 99% of the solubility limit of the acid in the solution, and preferably 75% to 98% of the solubility limit of the acid in the solution.

In one embodiment, the process comprises the following steps: (a) providing one or more vessels comprising therein at least one strongly acidic cation resin; (b) contacting the resin with a flow of a strong acid to produce an acid treated resin; (c) washing the resin with a flow of deionized water in a concurrent flow direction to the flow of strong acid to produce a resin substantially free of soluble acid; (d) contacting the acid-treated and washed resin with a flow in a countercurrent flow direction to the flow of strong acid of a feed composition comprising an amidoxime compound and one or more metals wherein the total metal concentration is greater than about 1000 ppb and the individual metal concentration is greater than about 250 ppb to produce a resin-treated amidoxime compound composition and spent resin; and (e) separating and recovering the resin-treated amidoxime compound composition.

Optionally and preferably, the amidoxime compound feed composition is kept under a blanket of an inert gas, such as nitrogen or any other gas inert under the conditions. Optionally, the process further comprises contacting the resin with a flow of deionized water prior to step (b) of contacting the resin with a strong acid, to produce a washed resin. Preferably, the flow of deionized water in this optional step is concurrent with the flow of strong acid. In practice, washing with DI water either before or after contacting the resin with strong acid is continued, until the resistivity of the output is at least about 5 M ohm.

Still further, optionally, the process comprises regenerating the spent resin for reuse after step (e).

Optionally, the washed resin is mostly or fully hydrated with water. The DI water used is the same as that disclosed above and can be "super DI water" (i.e., 18.3 M ohm).

Counter-current flows of the strong acid and the subsequent amidoxime compound solution ensure that the last traces of cations will tend to be at the input of the vessel for the amidoxime compound feed composition, maximizing cation removal by minimizing leaching of these last traces of cations into the amidoxime compound feed composition.

The preferred flow directions are upflow for the strong acid and downflow for the denser amidoxime compound feed composition. The reverse, that is, upflow of the denser amidoxime compound feed composition, can cause the resin to undesirably expand.

Suitable ionic membranes include, but are not limited to, cellulose membranes. Specific examples of such membranes include, but are not limited to, CUNO, Meriden Connecticut.

Suitable strongly acidic cation resins include, but are not limited to, sulfonic acid-substituted resins. Specific examples of such strongly acidic cation resins are DOWEX M-31 and DOWEX 650C UPW from Dow Chemical, Midland Mich., Amberlyst 15 from (Rohm & Haas Co., Philadelphia Pa., and DIAION PKT228L, DIAION SKT20L, DIAION RCP160M and DIAION CR20 from Itochu Specialty Chemicals Inc., Japan.

The DOWEX and AMBERLYST resins are all sulfonated copolymers of styrene and divinylbenzene, H form, but may differ in the degree of cross-linking and pore size. The DIAION PKT228L resin, having high selectivity on sodium, potassium and other monovalent trace metals and DIAION CR20 resins having high selectivity on divalent and transition metals, are also sulfonated copolymers. A strongly acidic cation resin has strong acid functional groups, i.e., the functional groups are highly dissociated when wet in the pH range 0-14.

Preferred ion exchange resins are strong acid cation resins specifically DIAION RCP160M, SKT20L, and RCP145H from Itochu Specialty Chemicals Inc. Japan. All these resin are sulfonated copolymers of styrene.

| Characteristics | 1.1.1 RCP145H | 1.1.2 SKT20L | 1.1.3 RCP160M |
|---|---|---|---|
| chemical structure | Br—R—SO3—H+ | R—SO3—H+ | R—SO3—H+ |
| physical structure | high porous | Gel type | Porous |
| ion form | H form | H form | H form |
| capacity (meq/ml resin), minimum | 0.8 | 1.8 | 1.5 |
| Moisture content (%) | 1.1.4 61~71 | 1.1.5 50-60 | 1.1.6 45-55 |
| particle size distribution | | | |
| on 1180μ(%) | <5 | <5 | |
| through 300μ(%) | <1 | <1 | |
| >710 m (%) | | | <25 |
| 250-710 m (%) | | | >75 |
| effective size (mm) | >0.4 | | |
| uniformity coefficient | <1.6 | <1.6 | |
| apparent density (g/l) | 734 (ref.) | 777 | 730 |

Procedures for handling strongly acidic cation resins, DI water, and low total metal concentration solutions are well known to those skilled in the art. Suitable materials of construction for wettable surfaces contacting the amidoxime compounds with low total metal concentration concentrations are nonmetallic. Example nonmetallic materials suitable as materials of construction or equipment linings include, but are not limited to, perfluorocarbon resins, high density poly(ethylene) (HDPE), high density poly(propylene) (HDPP), polyamides, polyesters, polyimides, polyurethanes, and the like. It cannot be emphasized too strongly that the handling of solutions having extremely low cation concentrations requires rigorous procedures, such as the use of a Class 100 cleanroom environment.

Suitable ion exchange resin vessels are preferably cylindrical and desirably each vessel provides a resin bed having a bed volume with a length to diameter ratio of at least about 1:1 and preferably >3:1. The vessel can be filled with a selected and preferably water-wet strongly acidic cation resin to give a depth of at least 18 in (46 cm) in the vessel. Two or more (multiple) vessels may be connected in series. Multiple vessels may also be connected in parallel to facilitate continuous operation. The advantages of multiple vessels are well known to those skilled in the art.

Channeling through the resin contained in the vessel, e.g., the resin bed can substantially reduce the effective capacity (meq/ml) of the resin. Techniques to minimize such channeling are well known to those skilled in the art.

Vessels are typically mounted vertically. Two or more vessels may be connected in series and/or in parallel or in combinations of these. Preferably the flow during the treatment of the amidoxime compound is down-flow.

Regeneration and flushing flows are preferably in the opposite, i.e., countercurrent, direction. Up-flow is preferred in this process. This reversed flow procedure provides a surprisingly effective demineralization at the outflow of the vessel during treatment of the amidoxime compound solution.

A filter to prevent elution of particulates can be attached to the outlet of each vessel. An example of a suitable filter is a 10-micrometer in-line filter. The vessels can also be equipped with a positive displacement pump having no metal parts that contact the liquid, such as a digitally controlled TEFLON diaphragm pump. An example pump head is an all-TEFLON diaphragm pump head, Model No. 07090-62 (Cole-Parmer Instrument Company, Vernon Hills, Ill., USA).

Prior to use, the strongly acidic cation resin or resins is placed into the suitable vessels and the resin is optionally flushed, that is, contacted with a flow of DI water to substantially remove water soluble materials from the resin. For example, the resin can be washed with at least 0.5 volume of the resin, and more preferably at least one volume of resin of DI water. The DI water flush produces washed resin. The washed resin is contacted with a strong acid in a desired flow direction to produce an acid-treated resin. The direction of flow of acid is preferably the same as that of the wash water, if used to previously or subsequently wash the resin. Though any strong acid can be used, it is preferred that a solution of from about 2 to about 10% sulfuric acid in DI water be used. The acid should have a low metal concentration. Suitable commercially available grades of sulfuric acid are Sulfuric Acid, VLSI, 95.0-97.0% and other such analyzed products with as low or lower metal concentration (Mallinkrodt Baker, Chesterfield, Mo., USA). Other strong mineral acids may be used instead of sulfuric, provided that grades having equivalent low metal concentrations are used.

The volume of strong acid used can depend on its concentration and the volume of the strongly acidic cation resin. General guides include (a) that it be sufficient to provide at least about 40 equivalents sulfuric acid/ft$^3$ resin (1400 eq m$^3$) when preparing resin nominally already in the H$^+$ form; or (b) that it provides from at least about 0.75 to at least about 2.0 equivalents of sulfuric acid/equivalent exchange capacity of the resin.

Used strongly acidic cation resin may be regenerated after step (e) using steps (b) and (c) of the procedure for resin preparation above, preferably with first contacting the resin with a flow of deionized water prior to step (b) of contacting the resin with a strong acid, to produce a washed resin and using sufficient strong mineral acid to restore the resin to its pristine low metal concentration. For regeneration of used resin that is not in the H$^+$ form, the general guides include (1) that the volume of strong acid used is sufficient to provide at least about 80 equivalents sulfuric acid/ft$^3$ or (2) that it provides from at least about 3.0 to at least about 4.0 equivalents of sulfuric acid/equivalent exchange capacity of the resin. The acid treatment is followed with DI water flushing until the resistivity of the output approaches that of fresh DI water. In practice, flushing with DI water is continued until the resistivity of the output is at least about 5 M ohm, higher resistivity may be desirable, and requires additional time and volume of DI water to be achieved.

An aqueous composition comprising an amidoxime compound having a total metal concentration and/or individual metal concentration higher than that described above for electronics grade wet chemicals (that is, greater than 1000 ppb of total metals and greater than 250 ppb of an individual metal) can then be contacted with the acid-treated resin. The contact can be carried out by any means known to one skilled in the art. For example, the solution can be passed through the strongly acidic cation resin by a mechanical force such as, for example, a positive displacement pump. Because such means are well known to one skilled in the art, a description is omitted herein for the interest of brevity. The rate of the aqueous composition or solution flowing through a resin bed can be conventionally measured as the "empty bed contact time" (EBCT). The EBCT is the time for one empty bed volume of feed to pass through the bed. The empty bed volume is the volume occupied by the wet resin. The EBCT can be about at least 1 minute, preferably at least 5 minutes, more preferably at least 10 minutes, or more preferably at least 15 minutes. The shorter contact times progressively are less efficient in the use of the resin capacity. To prevent dilution of the final product from residual DI water in the bed, the first portion of amidoxime compound through the beds may be collected separately as a forecut. A forecut is an initial portion of the eluate that is set aside for disposal or further treatment since it does not meet product specifications. This forecut can be taken until the concentration of the amidoxime compound is such that the entire subsequent main cut meets the final specifications for amidoxime compound concentration. Such forecuts typically have low metal concentration, and may be concentrated, retreated with new or regenerated resin, or used to aid the flushing of the DI water from a prepared resin bed.

The term "sample" is used to describe an aliquot, such as the 15 ml aliquot of the Examples, taken at suitable intervals for analyte measurement. The term "fraction" is used to describe the total volume of product eluted from the vessel, such as the approximately 600 ml of eluate in the Examples, collected between samples.

Samples for metals analysis (twelve metals: aluminum, calcium, chromium, copper, iron, lead, magnesium, manganese, nickel, potassium, sodium, and zinc) are taken at suitable intervals, such as hourly, with appropriate rigorous control to prevent contamination. When metal analyses reach the maximum product specifications, typically significant capacity remains in the resin. Optionally, the flow through the containers may be continued and the product, having a diminished metal concentration, but too high a metal concentration to meet final product specifications, can be collected for subsequent reprocessing with fresh or regenerated strongly acidic cation resin prepared as described hereinabove.

In practice and based on the specific set of specifications to be met, fractions are collected and combined until the average concentration of metals in the combined eluates approaches one or more of the specification limits. The column may, however, continue to be used to treat feed solution, but the effluent is separated for an application having either less stringent specifications or for retreatment through freshly prepared or regenerated resin. These subsequent fractions, while not meeting specifications, nevertheless contain reduced metal concentrations versus the original feed, and thus contribute a lower metal load in the retreatment process.

Temperatures and concentrations can be controlled to prevent crystallization or precipitation of the amidoxime compound. Solubility versus temperature information for aqueous solutions of amidoxime compounds is known or easily determined. Typical operating temperatures are ambient. In the case of a 70% amidoxime compound solution, for instance, manufacturer's recommendations include a recommendation for storage at temperatures between 10 to 50° C. to avoid formation of any solid phase.

Metal analyses can be made using any suitably sensitive methods, such as inductively coupled plasma mass spectrometry (ICP-MS).

Treated amidoxime compound solutions, such as those of the composition of this invention, meeting specifications are transferred to suitable non-metallic packaging containers or containers that are lined to prevent contact with metals. Suitable packaging and lining materials that may contact the low total metal concentration amidoxime compound compositions of the present invention are as described above for cation exchange resin containers and other process equipment.

The handling of ultra-low metal concentration liquids requires their rigorous protection from inadvertent contamination. These techniques are well known to those skilled in the art.

Also provided is a process for using the composition of this invention or the product produced by the process of this invention for cleaning of substrates or semiconductor-related equipment such as, for example, removing plasma ash residues or removing post etch residue. The process comprises contacting a substrate with a solution comprising the composition of this invention to clean the substrate. For purposes herein, this solution is referred to as the "cleaning solution." By "cleaning" it is meant to remove an undesirable material, such as a residue from producing the substrate, from the substrate. The substrate can be a surface or structure of a fully or partially fabricated electronic device or processing equipment. The substrate can comprise insulating materials, non-insulating materials, and combinations thereof.

The substrate can be, for example, a surface or structure of a metal or silicon-based material.

The term "metal" used herein as related to a surface or structure can include metal, metal alloy, metal compound, or combinations of two or more thereof. Examples of a metal surface or a metal structure include, but are not limited to, metal plugs, such as tungsten plugs; metal or metal compound stacks including two or more of titanium nitride, aluminum, copper, aluminum/copper alloy, titanium, tungsten, tantalum, and other metals useful in semiconductor fabrication; or at least a portion of one or more layers of metal nitrides, metal oxides, metal oxynitrides, and/or metal alloys with atoms or compounds other than metals such as phosphorus, boron, or sulfur, or combinations of two or more thereof.

Silicon-based material used here to provide a surface or structure can comprise silicon, silicon oxides, nitrides, oxynitrides, and modified silicon materials with atoms or compounds other than silicon such as phosphorus, boron, sulfur, carbon, fluorine, or germanium and combinations of two or more thereof.

The composition of this invention for cleaning, e.g., substrates or semiconductor-related equipment, is an aqueous solution. The composition of the invention comprises low metal concentrations, said metals present in the cleaning solution in the range of from about 0.01% to about 80%, preferably from about 1% to about 50%, or more preferably from about 5% to about 35% by weight of the amidoxime compound. The composition of the invention can further comprise from about 1% to about 75%, by weight, of an organic solvent. Typically, the cleaning solution prepared from the composition of this invention can be used by further dilution with DI water. Preferably "super" DI water is used to dilute the composition of this invention to prepare the cleaning solution. "Super" DI water has a very high resistivity, such as about 18 M ohm or higher. More preferably, not only is "super" DI water used, but also rigorous procedures are followed to minimize contamination, such as the use of a Class 100 cleanroom environment.

The solution for treating a substrate can also comprise an inorganic acid, such as phosphoric acid or salt thereof, in the range of from about 0.01% to about 5%. The acid can be, for example, phosphoric acid or its salt(s); pyrophosphoric acid; periodic acid; fluorosilicic acid; or organic acids, such as methanesulfonic acid and carboxylic acids, such as, citric acid, oxalic acid, glycolic acid, tartaric acid; or combinations of two or more thereof.

The solution for treating a substrate can also comprise a base as defined below in the range of from about 0.01% to about 50%. The base can be a quaternary ammonium compound, ammonium hydroxide, an alkylammonium hydroxide, hydroxylamine, alkylhydroxylamine, an alkanolamine, another amine or combinations of two or more thereof.

The solution for treating a substrate can also comprise a fluorine-containing compound in the range of from about 0.001% to about 0.5%. The fluorine compound can be hydrogen fluoride, ammonium fluoride, ammonium biflouride, or combinations of two or more thereof.

Other chelating agents can be present in the solutions, or compositions, of the invention and can range of from about 0.01% to about 25%. These other chelating agents can include, for example, catechol, ethylenediamine tetraacetic acid (EDTA), diethylene triamine pentaacetic acid (DTPA), or combinations of two or more thereof.

The solutions, or compositions, of the present invention can include a surfactant in the range of from about 0.01% to about 1%. The surfactant can be an epoxy-polyamide compound or other known surfactants.

For example, a solution can comprise or consist essentially of about 1% amidoxime compound, from about 1.5% to about 2.5% of phosphoric acid, from about 0.5% to about 1% of hydroxylamine, and from about 0.005% to about 0.04% of ammonium bifluoride. An alternative solution can comprise or consist essentially of about 3% amidoxime compound, from about 1.5% to about 2.5% of phosphoric acid, from about 0.5% to about 15% of hydroxylamine, from about 0.005% to about 0.04% of an ammonium bifluoride, and from about 0.05% to about 0.2% of an epoxy-polyamide compound. Still, another alternative solution can comprise or consist essentially of about 5% amidoxime compound, from about 1.5% to about 2.5% of phosphoric acid; from about 0.5% to about 1% of a hydroxylamine; and from about 0.005% to about 0.1% of amnmonium fluoride. All percents given for the solutions are by weight.

A cleaning solution comprising the composition disclosed above may be contacted with a semiconductor substrate by any method known to one skilled in the art such as, for example, submerging the substrate in the solution, by spraying directly onto the surface of the substrate, by flowing the solution over the substrate, or by flushing the substrate with the cleaning solution. Contact may be improved by mechanical agitation, ultrasonic and megasonic waves, bath circulation, rotation or other motion of the substrate. By improving contact, the time required for cleaning and damage to the substrates may be reduced.

The contacting can be carried out under various conditions, including, for example, ambient pressure; at a temperature in the range of from about 0 to about 100° C., or from about 10 to about 50° C., or from about 20 to about 30° C.; for a period of time, which can depend on the residue to be removed, temperature, or method of application and can be in the range of from about 1 to about 100 minutes, or from about 3 to about 50 minutes, or from about 3 to about 15 minutes, or from about 3 to about 20 minutes, or from about 5 to about 10 minutes, or from about 5 to about 15 minutes, or from about 5 to about 20 minutes. The contacting can also be ascertained by evaluating cleaning efficiency and material compatibility at various times.

The process can optionally comprise rinsing the substrate. Rinsing can be done with water, alcohol such as isopropyl alcohol, or both water and alcohol, or any rinse material known to one skilled in the art such as, for example, that disclosed in U.S. Pat. No. 5,981,454.

Materials and Test Methods

Test Method 1: Preparation and Operation of Cation Exchange Resin Columns

Deionized (DI) water used in the examples had a resistivity of 17.8 M ohm or greater, and was obtained from a Sybron-Barnstead NANOPURE II "turn-key" unit, available from Barnstead-Thermolyne (Dubuque, Iowa, USA).

In each Example, fresh cation exchange resin was charged to a 2.5 cm diameter×100 cm borosilicate glass column to a depth of approximately 24" (61 cm). The resin was then flushed (downflow) with DI water until the effluent resistivity was at least 10 M ohm. The resin was then treated (upflow) at 10 ml/min with approximately 2 bed volumes of 4% sulfuric acid (electronics grade), and subsequently flushed (upflow) with DI water until the bulk acid was displaced, as determined by effluent density. The bed was then further flushed (downflow) with DI water until the effluent resistivity read at least 5 M ohm. The amidoxime compound solutions to be purified were stored and fed under nitrogen. The amidoxime compound solutions were then fed downflow (counter-current to the acid pre-treatment step) at 10 ml/min through the preconditioned column. Generally, 15-ml samples of the bed effluent were taken every hour (about every 600 ml of eluate) into polyethylene bottles that had been triple-rinsed with DI water, and analyzed for metals using ICP-MS (Test Method 2).

Test Method 2. Determination of Microgram/Kilogram Concentrations of Metals in Amidoxime Compound Solutions Using (ICP-MS) Inductively Coupled Plasma-Mass Spectrometry.

The samples of amidoxime compounds, taken as described in Test Method 1, were diluted with DI water by a factor of to the level that can be and analyzed by inductively coupled plasma-mass spectrometry (ICP-MS) within the ranges of calibration standard, such as 10 to 1 ratio.

All sample preparation and analyses were carried out in a Class 100 cleanroom environment.

Determination limits for each element were approximately 1 ppb (1 part per billion, ppb) in the solution as collected from the ion exchange resin column. For analyses close to a detection limit, some sample-to-sample variation is not unexpected.

The equipment used included an Agilent 7500s or 7500cs ICP-MS system with a ShieldTorch interface (Agilent Technologies, Palo Alto Calif.); ChemStation and FileView software packages (Agilent Technologies, see above); a ASX-100 Micro Volume Autosampler (Agilent Technologies, see above); a Mettler AG285-CR analytical balance (Mettler-Toledo, Columbus Ohio); a Biohit e1000 electronic pipettor (Biohit Oyj, Helsinki, Finland); 1-ml polypropylene pipet tips (Corning, Inc., Corning N.Y.); 15-ml and 50-ml polypropylene centrifuge tubes with screw caps (Corning, Inc., see above); 18-M ohm deionized water (ASTM Type II water, ASTM D1193); high purity argon (stock number ARG-240L, MG Industries, Malvern Pa.); high purity hydrogen (scientific grade, MG Industries, see above); 100-μL PFA TEFLON micronebulizer (stock number PFA-100, Elemental Scientific, Omamidoxime compound NB); quartz torch with 2.5 mm ID (stock number G1833-65423, Agilent Technologies, see above); 6-ml autosampler vials (stock number G13160-65303 (Agilent Technologies, see above); ICP-MS tuning solution with Li, Y, Ce, Tl and Co at 10 ppb each (stock number 5184-3566, Agilent Technologies, see above); DUPEX CAL 3A multielement standard customized and supplied by Inorganic Ventures (Lakewood N.J.) that contains 27 elements at 100 mg/kg each and includes the twelve elements of interest (Na, Mg, Al, K, Ca, Cr, Mn, Fe, Ni, Cu, Zn, and Pb); ULTREX II 65.0-70% ultrapure nitric acid (J. T. Baker, Phillipsburg N.J.); OMNITRACE 69.0-70.0% nitric acid FMD Chemicals, Gibbstown N.J.) for cleaning purposes only); General-purpose plastic container with cover and at least 5-L capacity (VWR Scientific, West Chester Pa.); and unused, sealable plastic bags (VWR Scientific, see above). Tubes and vials did not necessarily have to be prepared in a cleanroom environment. The general-purpose container was prepared by filling it with DI water and adding OMNITRACE nitric acid to make an approximate 5% solution. Screw caps were removed from sample tubes and the tubes and caps submerged with minimal air pockets along with the autosampler vials into the nitric acid bath. The container was covered and the items allowed to leach in the bath for a minimum of 16 hours, when they were removed from the bath, rinsed thoroughly with DI water, and sealed and stored in plastic bags until ready for use.

Working standard solutions were prepared by pipetting 500 microL (μL) of the 100 mg/kg CAL3A stock standard into a clean 50-ml tube. DI water was used to dilute to the 50-ml mark, and the solution designated as the "1000 ppb working standard", which therefore contained 1000 ppb of each of the 12 analytes. 500 μL of the 1000 ppb working standard were pipetted into a clean 50ml tube, and diluted to the 50-ml mark with DI water. This solution is designated as the "10 ppb working standard".

Calibration standards were prepared by selecting one sample from the sample batch in order to prepare matrix-matched standards. This sample was designated as Sample A and is not a feed sample. 1.0 ml of Sample A was pipetted into each of nine clean 15-ml centrifuge tubes.

The following amounts of the working standards were pipetted into the tubes as shown in Table 1 below, and each tube was then diluted to the 10-ml mark with DI water. Each tube was kept capped with a clean screw cap until analysis.

TABLE 1

Preparation of Matrix Matched Calibration Standards

| Calibration Standard (ppb) | Sample A | Volume, ml 10 ppb std | 1000 ppb std | Total | Elemental Conc. (ppb) |
|---|---|---|---|---|---|
| 0 | 1.0 | 0 | 0 | 10.0 | 0 |
| 0.1 | 1.0 | 0.1 | 0 | 10.0 | 0.1 |
| 0.5 | 1.0 | 0.5 | 0 | 10.0 | 0.5 |
| 1 | 1.0 | 1 | 0 | 10.0 | 1 |
| 2 | 1.0 | 2 | 0 | 10.0 | 2 |
| 10 | 1.0 | 0 | 0.1 | 10.0 | 10 |
| 50 | 1.0 | 0 | 0.5 | 10.0 | 50 |
| 100 | 1.0 | 0 | 1 | 10.0 | 100 |
| 200 | 1.0 | 0 | 2 | 10.0 | 200 |

Amidoxime compound solutions were prepared by taring a clean, empty 15-ml centrifuge tube on the analytical balance, pipetting 1 ml of an eluate sample as received into the tube and recording the exact weight. This sample was diluted to a total of 10 ml and the exact weight again recorded. The tube was kept capped with a clean screw cap until analysis. This procedure was repeated for each sample, and the dilution factor for each sample calculated by dividing the total weight of the diluted sample by the weight of the sample as received.

In the case of feed samples having much higher cation concentrations, an additional dilution step was performed. The above procedure was repeated using 1 ml of the previously diluted feed sample, which was diluted to 10 ml using the same weighing and dilution factor calculation. The tube was kept capped with a clean screw cap until analysis. This procedure was repeated for all feed samples and the overall dilution factor recalculated for each. As a result of this additional dilution, feed samples were analyzed approximately 10 times more dilute than eluate samples. For feed samples with a concentration of 32,000 ppb or higher for a particular analyte, see below.

Unless noted otherwise, all analyses were performed on an Agilent 7500s (or 7500cs) ICP-MS system with ShieldTorch, using "cool plasma" (low RF power) conditions. Typical parameters for the argon plasma under cool plasma conditions are shown in Table 2. Carrier and blend gasses were derived from the same source of argon. The quartz torch as described above was used.

TABLE 2

Typical argon plasma parameters for cool plasma

| Parameter | Cool Plasma Conditions |
|---|---|
| RF poser (W) | 600-900 |
| Sample depth (mm) | 11-13 |
| Torch-H (mm)* | −2 to +2 |
| Torch V (mm)* | −2 to +2 |
| Carrier gas (L/min) | 0.8-1.3 |
| Blend gas (L/min) | 0.0-0.4 |
| Spray chamber temp (° C.) | 2 |

*relative horizontal (H) and vertical (V) position of the torch to the mass spectrometer A self-aspirating 100-microL PFA micronebulizer was used to introduce a sample or standard into the instrument's spray chamber at an approximate flow rate of 100 μL/min. The ICP-MS was tuned while introducing the tuning solution (see above) and following the guidelines in the Agilent 7500 ICP-MS ChemStation Operator's Manual (stock No. G18333-65423, July 2001, Agilent Technologies, see above). Typically, torch and lens parameters were optimized to maximize the signal for Co (mass/charge ratio or m/z 59) while minimizing the signals that were indicative of plasma and instrumental interferences (i.e., m/z 40, m/z 56, or m/z 80).

In instances when the background signal of the argon plasma at m/z 40 is relatively high, measurements of calcium were made with the use of the reaction cell of an Agilent 7500cs ICP-MS system. With reaction cell, normal plasma conditions as outlined in Table 3 were utilized. Hydrogen served as the reaction gas at a flow rate of 2.7 ml/min. Reference is made to the Agilent 7500 ICP-MS ChemStation Operator's Manual (see above) was used for additional details on the use and tuning with the reaction cell. The reaction cell procedure is further discussed in the "Appendix" below.

TABLE 3

Typical normal plasma parameters for use with the reaction cell

| Parameter | Normal Plasma Conditions |
|---|---|
| RF poser (W) | 1200-1600 |
| Sample depth (mm) | 4-10 |
| Torch-H (mm)* | −2 to +2 |
| Torch V (mm)* | −2 to +2 |
| Carrier gas (L/min) | 0.8-1.3 |
| Blend gas (L/min) | 0.0-0.4 |
| Spray chamber temp (° C.) | 2 |

*relative horizontal (H) and vertical (V) position of the torch to the mass spectrometer A program, referred to as a method by the ChemStation software, controlled the measurement and data acquisition for each sample and calibration standard. Analytes and pertinent parameters for each are given in Table 4.

TABLE 4

ChemStation measurement parameters

| Analyte | Mass (m/z) | Measurement Time per Mass (s)* | Number of Replications | Total Acquisition Time per Mass (s)* |
|---|---|---|---|---|
| Na | 23 | 0.5 | 3 | 1.5 |
| Mg | 24 | 0.5 | 3 | 1.5 |
| Al | 27 | 0.5 | 3 | 1.5 |
| K | 39 | 0.5 | 3 | 1.5 |
| Ca | 40 | 0.5 | 3 | 1.5 |
| Cr | 52 | 0.5 | 3 | 1.5 |
| Mn | 55 | 0.5 | 3 | 1.5 |
| Fe | 56 | 0.5 | 3 | 1.5 |
| Ni | 60 | 0.5 | 3 | 1.5 |
| Cu | 63 | 0.5 | 3 | 1.5 |
| Zn | 67 | 0.5 | 3 | 1.5 |
| Pb | 208 | 0.5 | 3 | 1.5 |

*These columns refer to the time period(s) during which the mass spectrometer collects data at the mass listed in Column 2 before pumping to the next mass Sample uptake and stabilization times were set accordingly in the same ChemStation method and were optimized during the tuning process since these times can vary between individual nebulizers. These times were adjusted so that the signal counts had a maximum relative standard deviation of 5% (n=200) when data acquisition began.

Two post-measurement sample rinses of at least 20 seconds (s) each were set in the ChemStation method. The two rinses consisted of two separate vials of deionized water with approximately 3% ultrapure nitric acid.

A different and more abbreviated ChemStation method was used when measuring calcium by an Agilent 7500cs ("Appendix" below). This program was similar to the first with the major exceptions that normal plasma conditions were used and calcium was the only analyte measured.

For the initial calibration verification, an aliquot of each of the nine calibration standards (Table 1) was placed into clean autosampler vials and the vials were loaded into the autosampler of the ICP-MS system. The standards were analyzed sequentially from the one with the lowest spiked concentrations (0 (zero) ppb) to the one with the highest (200 ppb). After all of the standards were analyzed and using the ChemStation software, the calibration curve for each analyte was verified to be linear with an $r^2$-value of at least 0.95.

Analyses of calibration standards and samples were made by placing an aliquot of each sample into clean autosampler vials, which were loaded into the autosampler of the ICP-MS system. A ChemStation sequence list was set up, saved, and executed. All sample dilution factors calculated above were entered in the sequence list. Note that the Agilent 7500cs utilized an additional sequence employing a similar yet different ChemStation method when measuring calcium (see "Appendix" Section below).

All nine calibration standards were analyzed at the beginning of the sequence and again at the end of sequence to verify that no significant signal drift occurred over the course of the measurements. All nine calibration standards are preferentially run periodically throughout the sequence, for instance each time after approximately 12 samples have been analyzed. At least one instrument blank consisting of DI water with approximately 10% ultrapure nitric acid was included in the sequence.

Feed samples, with higher analyte concentrations, were analyzed last in the sequence to minimize any possible cross-contamination between samples.

Results from the calibration standards were used to generate two separate calibration curves in ChemStation's Data Analysis module. The "low concentration" calibration curve utilized standards 0 ppb, 0.1 ppb, 0.5 ppb, 1 ppb, 2 ppb, and, in some instances, 10 ppb. The "high concentration" calibration curve utilized standards 0 ppb, 10 ppb, 50 ppb, 100 ppb, and 200 ppb. Each curve was initially constructed by the method of standard additions using Sample A (see above). Each curve was then converted to an external standard calibration curve using the ChemStation software.

All samples were processed using the low concentration curve and the "Do List" command. The calculated results (now multiplied by the appropriate dilution factors) were then compiled in the FileView software where they were saved in a spreadsheet format. This previous step was repeated using the high concentration curve to produce a second set of results in a spreadsheet format.

Results generated from FileView were compiled and formatted in a spreadsheet, with the majority of results derived from the low concentration curve. Only measurements that occurred above the range of the low concentration curve were reported from the high concentration curve.

For example, if the low concentration curve for a particular measurement range was 0-2 ppb, any measurements above 16 ppb (2 ppb multiplied by a typical dilution factor of approximately 8) were taken from the data of the high concentration curve. Consequently feed sample results were derived from the high concentration curve. Additionally, any measurement greater than an approximate value of 32000 ppb (2×200 ppb multiplied by a typical dilution factor of approximately 80) are required an additional dilution and reanalysis of the sample.

High levels of calcium in the amidoxime compound necessitated this reanalysis.

All results for the final reporting were rounded to the nearest whole pg/kg unit (i.e., 4.7 ppb reported as 5 ppb) and reported with a maximum of three significant figures. Measurements of 1 ppb or <1 ppb were reported as the worst case value of 1 ppb to enable averaging.

"Appendix Section" on the Measurement of Calcium

The use of an argon plasma under normal plasma conditions made calcium difficult to measure by ICP-MS since the primary isotopes of both calcium and argon had an atomic mass of 40 amu. ICP-MS analysts in recent years have rectified this problem by reducing the power of the plasma (referred to as "cool plasma" conditions), which in turn reduced the amount of interfering argon ions relative to those of calcium. This approach was utilized when using an Agilent 7500s ICP-MS system.

The upgraded Agilent 7500cs instrument was not necessarily optimized for cool plasma conditions because it had the ability to minimize or eliminate the effect of plasma interferences by another approach. The 7500cs contained a reaction cell between the plasma and the mass analyzer. In the case of calcium measurements, hydrogen was introduced into the cell, and the interfering argon ions could be eliminated by the one of two reactions:

$$Ar^+ + H_2 \rightarrow Ar + H^+ \quad (1)$$

Or $$Ar^+ + H_2 \rightarrow ArH^+ + H \quad (2)$$

In the case of the charge transfer reaction (1), the resulting Ar was no longer ionized and detected by the mass spectrometer at m/z 40. As a result of the atom abstraction (2), $Ar^+$ became $ArH^+$, which now could only be detected at m/z 41. $Ca^+$ did not react with $H^2$ within the reaction cell; thus, as a result of Reactions I and 2, only $Ca^+$ could be detected and measured at m/z 40. This was the approach utilized by this method to measure calcium when using an Agilent 7500cs ICP-MS.

Note that another concern regarding calcium measurements by ICP-MS is that calcium is one of the most common contaminants from sample handling, solvents, and other sources of background contamination. This analytical method required matrix-matched standards and utilized the method of standard additions, which together could mask background contamination at ultra trace levels especially when a true blank of calcium-free amidoxime compound is neither known nor available. This emphasized the need for the use of a cleanroom environment and ultra trace techniques when performing this method.

The reference for the above ICP-MS procedures is the Agilent 7500 ICP-MS ChemStation Operator's Manual (stock No. G18333-65423, July 2001, Agilent Technologies, Palo Alto Calif.).

EXAMPLES

Exemplary Purification of Amidoxime Compounds to Reduce Metal Ions Contents

Feed solutions of amidoxime compound were stored and fed to the resin columns under a nitrogen atmosphere. In the Examples, 15-ml samples of column eluate were collected following Test Method 1 and individually analyzed for twelve metals (aluminum, calcium, chromium, copper, iron, lead, magnesium, manganese, nickel, potassium, sodium, and zinc) using Test Method 2.

In the tabulated results, the averaged concentrations are shown, corresponding to the concentration that would be obtained by combining groups of fractions.

All fittings and process tubing were either PFA or TEFLON to avoid metal contamination. A TEFLON diaphragm pump drove flow through the bed.

Example 1

Purification of Amidoxime from Reaction Using Potassium Hydroxide as Catalyst Hexitol, 1,2,3,4,5,6-hexakis-O-[3(hydeoxyamino)-3-iminopropyl, [950752-25-7]

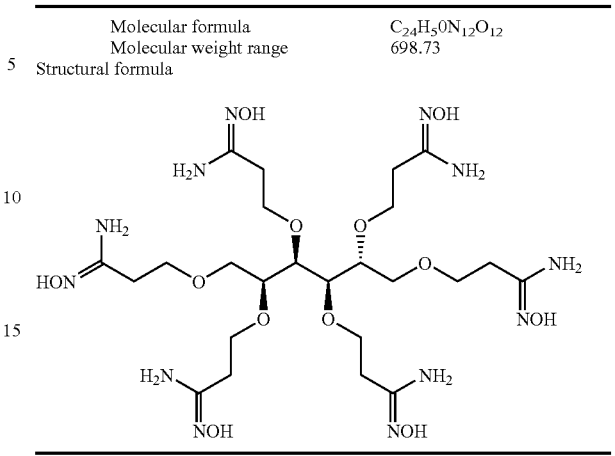

Molecular formula: $C_{24}H_5ON_{12}O_{12}$
Molecular weight range: 698.73
Structural formula An amidoxime molecule is prepared from the reaction of acrylonitrile and sorbitol using KOH as base catalyst and subsequently reacting with hydroxylamine solution to convert it into 1,2,3,4,5,6-hexakis-O-[3-(hydroxyamino)-3-iminopropyl Hexitol.

| Material | Supplier | Weight |
|---|---|---|
| 70% Sorbitol Solution | CornProduct Specialty | 668 Grams |
| KOH | Aldrich Chemical | 9 Grams |
| p-Hydroxyanisole | Aldrich Chemical | 0.3 Grams |
| Acrylonitrile | Aldrich Chemical | 824 Grams |
| Hydroxylamine Freebase (50%) | BASF | 1020 Grams |
| Total | | 2522 Grams |
| % KOH | | 0.36% |

The 1,2,3,4,5,6-hexakis-O-[3-(hydroxyamino)-3-iminopropyl Hexitol contains about 3600 ppm of potassium ions. A 10% solution is made and is passed through the column packed with RCP160M. Potassium concentration dropped from about 360 ppm to less than 10 ppb in a single pass and total ions concentration to less than 1000 ppb.

| Resin | RCP160M | | | | |
|---|---|---|---|---|---|
| Description | Strong acid cation sulfonated polystyrene, porous type | | | | |
| Reaction Catalyst | KOH catalyzed | | | | |

| | | Flow rate through bed (ml/min) 33 | | | |
|---|---|---|---|---|---|
| (ppb) | Before | Run 1 | Run 2 | Run 3 | Run 4 |
| Sodium (ppb) | 2154 | 9.69 | 3.87 | 1.65 | 1.36 |
| Magnesium (ppb) | 62 | 3.56 | 1.70 | 0.45 | 0.96 |
| Aluminum | 147 | 18.97 | 23.71 | 22.70 | 25.14 |
| Potassium (ppb) | 356500 | 15.18 | 3.29 | 4.57 | 5.35 |
| Calcium (ppb) | 2943 | 11.32 | 7.18 | 6.98 | 10.64 |
| Chromium (ppb) | 22 | 6.77 | 7.34 | 7.37 | 7.89 |
| Manganese (ppb) | 28 | 5.98 | 5.63 | 10.01 | 7.36 |
| Iron (ppb) | 243 | 41.38 | 42.72 | 41.35 | 40.70 |
| Nickel (ppb) | 100 | 4.54 | 4.47 | 7.30 | 6.12 |
| Copper (ppb) | 1199 | 1.88 | 3.44 | 4.84 | 1.16 |

-continued

| | | | | |
|---|---|---|---|---|
| Zinc (ppb) | 240 | 3.29 | 2.04 | 2.43 | 2.12 |
| Lead (ppb) | 502 | 0.22 | 0.10 | 0.10 | 0.08 |
| Total | 364141 | 123 | 105 | 110 | 109 |
| % Reduction of metal ions | | 99.966% | 99.971% | 99.970% | 99.970% |

Example 2

Purification of Amidoxime from Reaction using Metal Ion Free Catalyst—Tetramethylammonium Hydroxide 3,3'-(2,2-bis((3-(hydroxyamino)-3-iminopropoxy)methyl)propane-1,3-diyl)bis(oxy)bis(N-hydroxypropanimidamide)
Chemical Formula: $C_{17}H_{36}N_8O_8$
Molecular Weight: 480.52
Structural Formula

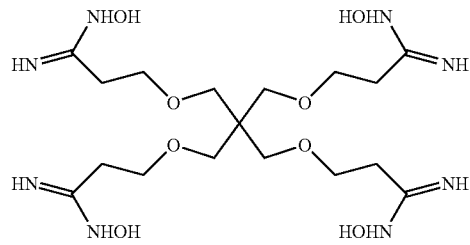

An amidoxime molecule is prepared from the reaction of acrylonitrile and pentaerythritol using tetramethylammonium hydroxide as base as metal ion free catalyst and subsequently reacting with hydroxylamine solution to convert it into 3,3'-(2,2-bis((3-(hydroxyamino)-3-iminopropoxy)methyl)propane-1,3-diyl)bis(oxy)bis(N-hydroxypropanimidamide).

| Material | Supplier | Weight |
|---|---|---|
| Pentaerythritol | Aldrich Chemical | 480 Grams |
| 25% TMAH | Sachem Chemical | 96 Grams |
| p-Hydroxyanisole | Aldrich Chemical | 0.12 Grams |
| Acrylonitrile | Aldrich Chemical | 224 Grams |
| Hydroxylamine Freebase (50%) | BASF | 264 Grams |
| | Total | 1064 Grams |

A 10% solution is made and is passed at various flow rates through the column packed with RCP160M. The exchanged solutions have a reduction of total metal ions of more than 50% in a single pass to total ions of less than 100 ppb.

| Resin | RCP160M | | | | |
|---|---|---|---|---|---|
| Description | Strong acid cation sulfonated polystyrene, porous type | | | | |
| Reaction Catalyst | TMAH catalyzed | | | | |

| | | Flow rate through bed (ml/min) | | | |
|---|---|---|---|---|---|
| | | 2.7 | 4.3 | 29 | 33 |
| Metals | Before | | After | | |
| Aluminum | 23 | 5.9 | 26.0 | 14 | 1.6 |
| Calcium (ppb) | 11 | 12.0 | 4.7 | 9 | 3.1 |
| Chromium (ppb) | 0 | 0.0 | 0.3 | 1 | 0.0 |

-continued

| | | | | | |
|---|---|---|---|---|---|
| Copper (ppb) | 1 | 0.3 | 0.6 | 1 | 0.3 |
| Lead (ppb) | 1 | 0.1 | 0.2 | 1 | 0.0 |
| Magnesium (ppb) | 1 | 2.0 | 0.7 | 1 | 1.5 |
| Manganese (ppb) | 0 | 0.0 | 2.3 | 0 | 0.0 |
| Potassium (ppb) | 5 | 1.1 | 0.4 | 4 | 0.4 |
| Sodium (ppb) | 59 | 3.5 | 1.9 | 6 | 2.0 |
| Nickel (ppb) | 1 | 1.4 | 1.3 | 1 | 1.3 |
| Zinc (ppb) | 3 | 1.4 | 6.3 | 3 | 1.3 |
| Total | 105 | 28 | 45 | 40 | 12 |
| % Reduction of metal ions | | 74% | 57% | 62% | 89% |

| Resin | SKT20L |
|---|---|
| Description | Strong acid cation sulfonated polystyrene, gel type |
| Reaction Catalyst | TMAH catalyzed |

| | | Flow rate through bed (ml/min) |
|---|---|---|
| | | 73 |
| Metals | Before | After |
| Aluminum | 22.1 | 20.8 |
| Calcium (ppb) | 9.3 | 9.7 |
| Chromium (ppb) | 0.2 | 0.2 |
| Copper (ppb) | 1.4 | 1.3 |
| Lead (ppb) | 0.2 | 0.2 |
| Magnesium (ppb) | 0.9 | 0.7 |
| Manganese (ppb) | 0.1 | 0.1 |
| Nickel (ppb) | 1.0 | 1.0 |
| Potassium (ppb) | 4.3 | 1.1 |
| Sodium (ppb) | 64.4 | 7.4 |
| Zinc (ppb) | 4.0 | 4.1 |
| Total | 107.8 | 46.5 |
| % Reduction of metal ions | | 56.87% |

Example 3

Purification Using Ion Exchange Membrane N',2-dihydroxyacetimidamide is Prepared by Reaction of Glycolonitrile (2-hydroxyacetonitrile) with Hydroxylamine

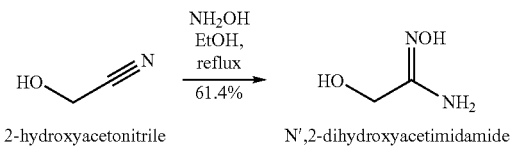

2-hydroxyacetonitrile      N',2-dihydroxyacetimidamide

Glycolonitrile (1 g, 17.5 mmol) and hydroxylamine (50% in water, 2.15 ml, 35 mmol, 2 eq) in EtOH (10 ml) were stirred under reflux for 6 hours and then at room temperature for 24 hours. The solvent was evaporated and the residue was purified by column chromatography (silica, 1:3 EtOH-$CH_2Cl_2$) to give water soluble N',2-dihydroxyacetimidamide (0.967 g, 61.4%) as an off-white solid, mp 63-65° C.

Dissolve 3 grams of N',2-dihydroxyacetimidamide in 100 ml of DI water and the solution is passed through CUNO Zeta Plus 40Q ion exchange membrane. Trace metals are analyzed using ICP-MS (Test Method 2) on samples before and after filtration through the ionic membrane. There is a reduction of total trace metals by 81% and total ions concentration to less than 1000 ppb.

| CUNO Zeta Plus 40Q, Diameter = 48 mm | | |
|---|---|---|
| Metal (ppb) | Before | After |
| Sodium | 2967.50 | 511.55 |
| Magnesium | 125.25 | 1.24 |
| Aluminum | 191.05 | 67.48 |
| Potassium | 223.45 | 8.39 |
| Calcium | 183.35 | 74.34 |
| Chromium | 3.75 | 4.07 |
| Manganese | 7.18 | 8.93 |
| Iron | 83.07 | 24.16 |
| Nickel | 12.58 | 12.44 |
| Copper | 10.89 | 7.01 |
| Zinc | 47.19 | 25.06 |
| Lead | 6.61 | 1.19 |
| Total | 3861.87 | 745.85 |
| % Reduction in total metal ions | | 81% |

Trace metals present in amidoxime compound solution from this invention can be reduced significantly using ionic membrane, such as CUNO Zeta Plus 40Q membrane. It is not as effective comparing to ion exchange resin.

Summary of preferred amidoxime compounds from nitriles and not limited to

| ID | Nitrile (N) | Amidoxime (AO) |
|---|---|---|
| 3 | 3-hydroxypropionitrile | N',3-dihydroxypropanimidamide |
| 4 | Acetonitrile | NN'-hydroxyacetimidamide |
| 5 | 3-methylaminopropionitrile | N'-hydroxy-3-(methylamino)propanimidamide |
| 6 | Benzonitrile | N'-hydroxybenzimidamide |
| 8 | 3,3' iminodipropionitrile | 3,3'-azanediylbis(N'-hydroxypropanimidamide) |
| 9 | octanonitrile | N'-hydroxyoctanimidamide |
| 10 | 3-phenylpropionitrile | N'-hydroxy-3-phenylpropanimidamide |
| 11 | ethyl 2-cyanoacetate | 3-amino-N-hydroxy-3-(hydroxyimino)propanamide |
| 12 | 2-cyanoacetic acid | 3-amino-3-(hydroxyimino)propanoic acid |
| 13 | 2-cyanoacetamide | 3-amino-3-(hydroxyimino)propanamide |
| 15 | adiponitrile | N'1,N'6-dihydroxyadipimidamide |
| 16 | sebaconitrile | N'1,N'10-dihydroxydecanebis(imidamide) |
| 17 | 4-pyridinecarbonitrile | N'-hydroxyisonicotinimidamide |
| 18 | m-tolunitrile | N'-hydroxy-3-methylbenzimidamide |
| 19 | phthalonitrile | isoindoline-1,3-dione dioxime |
| 20 | glycolonitrile | N',2-dihydroxyacetimidamide |
| 21 | chloroacetonitrile | 2-chloro-N'-hydroxyacetimidamide |
| 22 | benzyl cyanide | product N'-hydroxy-2-phenylacetimidamide |
| 24 | Anthranilonitrile | 2-amino-N'-hydroxybenzimidamide |
| 25 | 3,3' iminodiacetonitrile | 2,2'-azanediylbis(N'-hydroxyacetimidamide) |
| 26 | 5-cyanophthalide | N'-hydroxy-1-oxo-1,3-dihydroisobenzofuran-5-carboximidamide |
| 27 | 2-cyanophenylacetonitrile | 3-aminoisoquinolin-1(4H)-one oxime or 3-(hydroxyamino)-3,4-dihydroisoquinolin-1-amine |
| 29 | cinnamonitrile | N'-hydroxycinnamimidamide |
| 30 | 5-hexynenitrile | 4-cyano-N'-hydroxybutanimidamide |
| 31 | 4-chlorobenzonitrile | 4-chloro-N'-hydroxybenzimidamide |

For example, N3 represents 3-hydroxypropionitrile and AO3 is N',3-dihydroxypropanimidamide from reacting 3-hydroxypropionitrile with hydroxylamine to form its corresponding amidoxime Summary of preferred amidoxime compounds from nitrites by cyanoethylation of nucleophilic compounds and not limited to the list below

| ID | Nucleophilic compounds | Cyanoethylated Compounds (CE) | Amidoxime from cyanoethylated compounds (AO) |
|---|---|---|---|
| 01 | Sorbitol | 1,2,3,4,5,6-hexakis-O-(2-cyanoetyl)hexitol | 1,2,3,4,5,6-hexakis-O-[3-(hydroxyamino)-3-iminopropyl Hexitol, |
| 07 | ethylenediamine | 3,3',3'',3'''-(ethane-1,2-diylbis(azanetriyl))tetrapropanenitrile | 3,3',3'',3'''-(ethane-1,2-diylbis(azanetriyl))tetrakis(N'-hydroxypropanimidamide) |
| 28 | ethylene glycol | 3,3'-(ethane-1,2-diylbis(oxy))dipropanenitrile | 3,3'-(ethane-1,2-diylbis(oxy)bis(N'-hydroxypropanimidamide) |

| ID | Nucleophilic compounds | Cyanoethylated Compounds (CE) | Amidoxime from cyanoethylated compounds (AO) |
|---|---|---|---|
| 34 | diethylamine | 3-(diethylamino)propane nitrile | 3-(diethylamino)-N'-hydroxypropanimidamide |
| 35 | piperazine | 3,3'-(piperazine-1,4-diyl)dipropanenitrile | 3,3'-(piperazine-1,4-diyl)bis(N'-hydroxypropanimidamide) |
| 36 | 2-ethoxyethanol | 3-(2-ethoxyethoxy) propanenitrile | 3-(2-ethoxyethoxy)-N'-hydroxypropanimidamide |
| 37 | 2-(2-dimethylamino ethoxy)ethanol | 3-(2-(2-(dimethylamino) ethoxy)ethoxy) propanenitrile | 3-(2-(2-(dimethylamino)ethoxy)ethoxy)-N'-hydroxypropanimidamide |
| 38 | isobutyraldehyde | 4,4-dimethyl-5-oxo pentanenitrile | N'-hydroxy-4,4-dimethyl-5-oxopentanimidamide |
| 39 | diethyl malonate | diethyl 2,2-bis(2-cyanoethyl) malonate | 2,2-bis(3-amino-3-(hydroxyimino)propyl)malonic acid |
| 40 | aniline | 3-(phenylamino) propanenitrile | N'-hydroxy-3-(phenylamino) propanimidamide |
| 41 | ammonia | 3,3',3''-nitrilotri propanenitrile | 3,3',3''-nitrilotris(N'-hydroxypropanimidamide) |
| 42 | diethyl malonate | 2,2-bis(2-cyanoethyl) malonic acid | 2,2-bis(3-amino-3-(hydroxyimino)propyl)malonic acid |
| 43 | Glycine (Mono cyanoethylated) | 2-(2-cyanoethylamino)acetic acid | 2-(3-amino-3-(hydroxyimino)propylamino)acetic acid |
| 44 | Glycine (Dicyanothylated) | 2-(bis(2-cyanoethyl)amino) acetic acid | 2-(bis(3-amino-3-(hydroxyimino)propyl)amino)acetic acid |
| 45 | malononitrile | propane-1,1,3-tricarbonitrile | N1,N'1,N'3-trihydroxypropane-1,1,3-tris(carboximidamide) |
| 46 | cyanoacetamide | 2,4-dicyano-2-(2-cyanoethyl)butanamide | 5-amino-2-(3-amino-3-(hydroxyimino)propyl)-2-(N'-hydroxycarbamimidoyl)-5-(hydroxyimino)pentanamide |
| 47 | Pentaerythritol | 3,3'-(2,2-bis((2-cyanoethoxy) methyl) propane-1,3-diyl)bis(oxy) dipropanenitrile | 3,3'-(2,2-bis((3-(hydroxyamino)-3-iminopropoxy)methyl)propane-1,3-diyl)bis(oxy)bis(N-hydroxypropanimidamide) |
| 48 | N-methyl diethanol amine | 3,3'-(2,2'-(methylazanediyl) bis(ethane-2,1-diyl) bis(oxy))dipropanenitrile | 3,3'-(2,2'-(methylazanediyl)bis(ethane-2,1-diyl)bis(oxy))bis(N'-hydroxypropanimidamide) |
| 49 | glycine anhydride | 3,3'-(2,5-dioxopiperazine-1,4-diyl)dipropanenitrile | 3,3'-(2,5-dioxopiperazine-1,4-diyl)bis(N'-hydroxypropanimidamide) |
| 50 | acetamide | N,N-bis(2-cyanoethyl)acetamide | N,N-bis(3-amino-3-(hydroxyimino)propyl)acetamide |
| 51 | anthranilonitrile | 3,3'-(2-cyanophenylazanediyl) dipropanenitrile | 3,3'-(2-(N'-hydroxycarbamimidoyl)phenylazanediyl)bis(N'-hydroxypropanimidamide) |
| 52 | diethanolamine | 3,3'-(2,2'-(2-cyanoethylazanediyl)bis(ethane-2,1-diyl)bis(oxy))dipropane nitrile | 3,3'-(2,2'-(3-amino-3-(hydroxyimino)propylazanediyl)bis(ethane-2,1-diyl))bis(oxy)bis(N'-hydroxypropanimidamide) |

For example. CE36 represents cyanoethylated product of ethylene glycol and AO36 is from reacting 3-(2ethoxyethoxy) propanenitrile with hydroxylamine to form its corresponding amidoxime.

As is illustrated in FIG. 1, the present invention includes the utilization of two metal reduction technologies to achieve extremely low trace metals levels after the synthesis of the amidoxime compounds.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalence of such metes and bounds are therefore intended to be embraced by the appended claims.

While the invention has been described and illustrated herein by references to various specific materials, procedures and examples, it is understood that the invention is not restricted to the particular combinations of materials and procedures selected for that purpose. Numerous variations of such details can be implied as will be appreciated by those skilled in the art. It is intended that the specification and examples be considered as exemplary, only, with the true scope and spirit of the invention being indicated by the following claims. All references, patents, and patent applications referred to in this application are herein incorporated by reference in their entirety.

What is claimed is:

1. A composition comprising one or more amidoxime compounds and one or more metals wherein the one or more amidoxime compounds is selected from the group consisting of 1,2,3,4,5,6-hexakis-O-[3-(hydroxyamino)-3-iminopropyl hexitol; 3,3',3''3'''-(ethane-1,2-diylbis (azanetriyl))tetrakis (N'-hydroxypropanimidamide); 3,3'-(ethane-1,2-diylbis (oxy))bis(N'-hydroxypropanimidamide); 3-(diethylamino)-N'-hydroxypropanimidamide; 3,3'-(piperazine-1,4-diyl)bis (N'-hydroxypropanimidamide); 3-(2-ethoxyethoxy)-N'-hydroxypropanimidamide; 3-(2-(2-(dimethylamino)ethoxy) ethoxy)-N'-hydroxypropanimidamide; N'-hydroxy-3-(phenylamino)propanimidamide; 3,3',3''-nitrilotris (N'-hydroxypropanimidamide); 3,3'-(2,2-bis((3-(hydroxyamino)-3-iminopropoxy) methyl)propane-1,3-diyl) bis(oxy)bis(N-hydroxypropanimidamide); 3,3'-(2,2'-(methylazanediyl)bis(ethane-2,1-diyl)bis(oxy))bis(N-hydroxypropanimidamide); N,N-bis(3-amino-3-(hydroxyimino)propyl)acetamide; 3,3'-(2-(N'-hydroxycarbamimidoyl) phenylazanediyObis(N'-hydroxypropanimidamide); 3,3'-(2,2'-(3-amino-3-(hydroxyimino)propylazanediyl)bis(ethane-2,1-diyl))bis (oxy)bis(N'-hydroxypropanimidamide) and combinations thereof, and the total metal concentration is less than 1000 ppb and the concentration of any individual metal of the composition is less than 250 ppb.

2. The composition of claim 1 wherein the one or more amidoxime compounds is selected from the group consisting of 3,3',3'',3'''-(ethane-1,2-diylbis (azanetriyl))tetrakis(N'-hydroxypropanimidamide); 3,3'-(ethane-1,2-diylbis (oxy))bis(N'-hydroxypropanimidamide); 1,2,3,4,5,6-hexakis-O-[3-(hydroxyamino)-3-iminopropyl hexitol; 3,3'-(2,2-bis((3-(hydroxyamino)-3-iminopropoxy)methyl)propane-1,3-diyl) bis(oxy)bis(N-hydroxypropanimidamide); N',2-dihydroxy-acetimidamide and combinations thereof.

3. The composition of claim 2 wherein the concentration of the one or more amidoxime compounds is present in an amount from 1% to 60% of the solubility limit of the one or more amidoxime compounds in the composition.

* * * * *

UNITED STATES PATENT AND TRADEMARK OFFICE
CERTIFICATE OF CORRECTION

PATENT NO. : 7,838,483 B2
APPLICATION NO. : 12/260649
DATED : November 23, 2010
INVENTOR(S) : Wai Mun Lee and Charles C. Y. Chen It is certified that error appears in the above-identified patent and that said Letters Patent is hereby corrected as shown below:

Column 5, line 64: After "cyanoethylated" delete "nitrite" and replace with -- nitrile --
Column 6, line 29: After "(1.47" delete "go" and replace with -- g, --
Column 8, line 20: Delete "acrytonitrile" and replace with -- acrylonitrile --
Column 13, line 65: Delete "$C_2H_3NO$ " and replace with -- $C_2H_5NO$ --
Column 14, line 20: After "0.06" delete "u," and replace with -- g, --
Column 16, line 60: Delete "$C_3H_{12}O_4$ " and replace with -- $C_5H_{12}O_4$ --
Column 18, line 21: Delete "$C_4H_{12}NO_2$" and replace with -- $C_4H_{11}NO_2$ --
Column 19, line 40: After "0.79" delete "a" and replace with -- g, --
Column 26, line 33: Delete "$C_9H_{21}N_3O_5$ " and replace with -- $C_9H_{21}N_3O_3$ --
Column 26, line 66: Delete "$C_{13}H_{28}N_4O_2$" and replace with -- $C_{13}H_{20}N_4O_2$ --
Column 28, line 34: Delete "$C_{14}H_{28}N_6$" and replace with -- $C_{14}H_{20}N_6$ --
Column 29, line 15: Delete "$C_{17}H_{14}N_4O_4$" and replace with -- $C_{17}H_{24}N_4O_4$ --
Column 29, line 41: After "(2,2-" delete "his" and replace with -- bis --
Column 31, line 41: Delete "$C_{14}H_{19}N_3O_2$" and replace with -- $C_{11}H_{19}N_3O_2$ --
Column 31, line 47: Delete "$C_{14}H_{25}N_5O_4$" and replace with -- $C_{11}H_{25}N_5O_4$ --
Column 32, line 9: Delete "$C_8H_{18}N_6O_4$" and replace with -- $C_8H_{18}N_4O_4$ --
Column 33, line 30: Delete "$C_{24}H_{12}N_6O_6$" and replace with -- $C_{24}H_{32}N_6O_6$ --
Column 33, line 48: Delete "$C_{24}H_{56}N_{12}O_{12}$" and replace with -- $C_{24}H_{50}N_{12}O_{12}$ --
Column 37, line 13: Delete "$C_9H_8N_2$" and replace with -- $C_9H_6N_2$ --
Column 38, line 13: Delete "$C_9H_{17}N_3O$" and replace with -- $C_9H_{11}N_3O$ --
Column 39, line 34: Delete "-pyridlinecarbonitrile" and replace with -- pyridinecarbonitrile --
Column 40, line 65: Delete "hut" and replace with -- but --
Column 45, line 51: Delete "amnmonium" and replace with -- ammonium --
Column 47, line 17: Delete "FMD" and replace with -- EMD --
Column 51, line 21: After "Reactions" delete "I" and replace with -- 1 --
Column 51, line 66: Delete "(hydeoxyamino)" and replace with -- (hydroxyamino) --
Column 56, line 54: Delete "nitrites" and replace with -- nitriles --
Column 58, line 61: Delete "phenylazanediyObis(" and replace with -- phenylazanediy)bis( --

Signed and Sealed this
Third Day of May, 2011

David J. Kappos
*Director of the United States Patent and Trademark Office*